(12) United States Patent
Petek et al.

(10) Patent No.: US 8,878,596 B2
(45) Date of Patent: Nov. 4, 2014

(54) HIERARCHICAL SINGLE MOLECULE SWITCH BASED ON STIMULATED INTERNAL CLUSTER MOTION WITHIN A HOLLOW MOLECULAR CAGE

(71) Applicant: University of Pittsburgh Of the Commonwealth System of Higher Education, Pittsburgh, PA (US)

(72) Inventors: Hrvoje Petek, Pittsburgh, PA (US); Tian Huang, Corning, NY (US); Jin Zhao, Pittsburgh, PA (US); Lothar Dunsch, Dresden (DE); Shangfeng Yang, Hefei (CN)

(73) Assignee: University of Pittsburgh-Of the Commonwealth System of Higher Education, Pittsburgh, PA (US)

( * ) Notice: Subject to any disclaimer, the term of this patent is extended or adjusted under 35 U.S.C. 154(b) by 0 days.

(21) Appl. No.: 13/899,234

(22) Filed: May 21, 2013

(65) Prior Publication Data
US 2013/0321064 A1 Dec. 5, 2013

Related U.S. Application Data

(60) Provisional application No. 61/649,599, filed on May 21, 2012.

(51) Int. Cl.
*H03K 17/74* (2006.01)
*H01L 51/05* (2006.01)

(52) U.S. Cl.
CPC ................................. *H01L 51/0595* (2013.01)
USPC ............................. 327/493; 327/494; 327/508

(58) Field of Classification Search
USPC ............ 327/92, 423–424, 493–508, 587, 588
See application file for complete search history.

(56) References Cited

U.S. PATENT DOCUMENTS

| | | | |
|---|---|---|---|
| 6,986,876 B2 * | 1/2006 | Smalley et al. | 423/447.1 |
| 7,008,604 B2 * | 3/2006 | Smalley et al. | 423/447.1 |
| 2008/0063585 A1 * | 3/2008 | Smalley et al. | 423/414 |
| 2008/0247930 A1 * | 10/2008 | Hotto | 423/262 |
| 2009/0004094 A1 * | 1/2009 | Smalley et al. | 423/447.1 |
| 2009/0105386 A1 * | 4/2009 | Okada et al. | 524/424 |
| 2009/0169463 A1 * | 7/2009 | Smalley et al. | 423/445 B |
| 2013/0321064 A1 * | 12/2013 | Petek et al. | 327/493 |

* cited by examiner

*Primary Examiner* — Brandon S Cole
(74) *Attorney, Agent, or Firm* — Kegler Brown Hill & Ritter; James J. Pingor

(57) ABSTRACT

Systems and methods related to single molecule switching devices are disclosed. One example method can include the step of applying a tunneling current across a tunneling junction. The tunneling junction can include an endohedral fullerene that includes a fullerene cage and a trapped cluster or a trapped atom. Such a method can also include exciting one or more internal motions of the trapped cluster or the trapped atom based at least in part on the tunneling current, and changing the conductance of the endohedral fullerene based at least in part on the one or more excited internal motions. One or more electronic processes can be controlled based at least in part on the changed conductance of the endohedral fullerene.

20 Claims, 21 Drawing Sheets

HIERARCHICAL SINGLE MOLECULE SWITCH BASED ON STIMULATED INTERNAL CLUSTER MOTION WITHIN A HOLLOW MOLECULAR CAGE

CROSS-REFERENCE TO RELATED APPLICATIONS

This application claims the benefit of U.S. Provisional Patent application Ser. No. 61/649,599 entitled 'A HIERARCHICAL SINGLE MOLECULE SWITCH BASED ON STIMULATED INTERNAL CLUSTER MOTION WITHIN A HOLLOW MOLECULAR CAGE' and filed May 21, 2012 The entirety of the above-noted application is incorporated by reference herein.

BACKGROUND

The inexorable progress to the ultimate miniaturization of electronic devices provides the impetus for development of molecular electronics. The ultimate goal of research in molecular electronics is the utilization of single molecules as functional electronic elements and their integration into more complex devices. In comparison with the conventional semiconductor devices, molecular electronic devices can be smaller, faster, and dissipate less energy during operation. Moreover, the diversity of molecular materials presents an abundance of functional elements and concepts for construction of single molecule devices based on theoretical modeling and atomic scale architectonics employing chemical synthesis, molecular self-organization, and nanofabrication. Following the first proposal of a unimolecular rectifier with the D-G-A structure, a variety of the elementary electronic devices based on single molecules, including switches, diodes and transistors, have been conceived and demonstrated.

As the elementary units of logic gates and electronic memories, molecular switching devices are arguably the simplest and most fundamentally important molecular electronic components, which have been investigated with vigor since their first proposal. A typical molecular switching device consists of a junction formed by two electrodes forming an electrical contact to a single molecule active element. The current flowing through the junction is controlled by the molecular configuration, and can be switched reversibly among different states under various stimuli, such as electron charge, electric field, light, short-range chemical force, heat, and magnetic field. Common embodiments of single molecule switches are a controllable break-junction or a tunneling junction formed by metal substrate and tip within a scanning tunneling microscope (STM). In the former case, functionalized molecules chemically attach to each electrode, whereas in the latter case, although molecules can also be attached to both electrodes, usually the STM tip forms a tunneling barrier, and even the substrate can consist of a thin insulating layer to form double barrier junction.

The first demonstration of a molecular level switch was reported for an STM junction consisting of a Xe atom between a nickel substrate and a tungsten tip. By applying voltage pulses with opposite polarity, single Xe atoms could be reversibly transferred between the tip and the substrate, with the concomitant change in conductivity. Because the conductivity is modulated by changes in the electrode through interaction with the atomic/molecular element rather than within the molecule itself, such a switch is considered to be extrinsic. Other extrinsic switches have incorporated oligophenylene-ethynylene derived molecules, bipyridine, $C_{60}$ and $H_2$. By contrast, intrinsic single molecule switches utilize the specific switching behavior of the molecule itself.

The variety of molecular materials offers much larger range of intrinsic switching behavior employing multiple conformational, charging and magnetic mechanisms. Because the switching mechanism can be designed by chemical means, the conformational switching among isomers has been widely studied. Inspired by the primary switching events in vision and bacterial photosynthesis, which rely on the conformational change through cis-trans isomerization, single-molecule switches using azobenzene and its derivatives and analogues have been obvious targets of research. Whereas tunneling electron induced switching is found in various azobenzene derivatives, reports of related photoswitching are rare, the reason being that the switching quantum yields are extremely small, and electrons can be delivered by STM specifically to a single molecule within a junction, whereas photons irradiate much wider area. The quantum yields are small because the strong chemical and electronic interactions of molecules with the substrate can sterically hinder the isomerization and quench the electronically excited states of the molecule. To ameliorate these difficulties, prior work modified the pristine azobenzene by functionalizing the benzene ring with tert-butyl side groups. The four added 'legs' lift the active elements of azobenzene molecules from the surface to enable the photoswitching. In another approach, the photoswitching by incorporating azobenzene derived molecules into self-assembled monolayer of dodecanethiols was demonstrated. The derivatized molecules adopt a vertical-standing structure with a short alkane spacer separating the azobenzene and the substrate. The upright molecules therefore have more degrees-of-freedom for conformational change and are also more weakly coupled to the substrate than recumbent ones.

A disadvantage of switches that are based on a large structural change of single molecules is that it is difficult to track the conformational changes with an STM tip in order to actuate and record the switching behavior over multiple switching cycles, as might be essential for a practical operation of a single molecules switch. This problem is compounded when combining individual molecules to create devices and circuits with more complex functionality, where molecular conformational changes may not be conducive to stable device performance. Unfortunately, most of the single molecule switches that have been realized so far in this category are based on molecules that undergo considerable structural changes, such as the catenane, rotaxane, diarylethene and porphyrin derivatives. Other switches, for example, based on the hydrogen atom tautomerziation in naphthalocyanine, or the mechanical oscillation of the N—H bond in an engineered melamine, minimize the overall structural change, but their functional N—H groups are vulnerable to external chemical perturbations that can deactivate the function, such as hydrogen bond formation with impurity molecules like $H_2O$. The discovery of molecular switches with minimal structural change, strong chemical stability with respect to switching, and adamant to environmental perturbations, therefore, remains an important step towards achieving practical single molecule switches.

SUMMARY

The following presents a simplified summary of the innovation in order to provide a basic understanding of some aspects of the innovation. This summary is not an extensive overview of the innovation. It is not intended to identify key/critical elements of the innovation or to delineate the scope of the innovation. Its sole purpose is to present some concepts of the innovation in a simplified form as a prelude to the more detailed description that is presented later.

The innovation disclosed and claimed herein, in one aspect thereof, comprises a system that can employ a single molecule switch in accordance with aspects of the subject innovation.

In another aspect, the subject innovation can include methods of using a single molecule switch. One example method can include the step of applying a tunneling current across a tunneling junction. The tunneling junction can include an endohedral fullerene that includes a fullerene cage and a trapped cluster or a trapped atom. Such a method can also include exciting one or more internal motions of the trapped cluster or the trapped atom based at least in part on the tunneling current, and changing the conductance of the endohedral fullerene based at least in part on the one or more excited internal motions. One or more electronic processes can be controlled based at least in part on the changed conductance of the endohedral fullerene.

Further aspects of the subject innovation can include methods of fabricating single molecule switches. Such a method can include the act of selecting an endohedral fullerene for use in a single molecule switch. The endohedral fullerene can include a fullerene cage and a trapped cluster or a trapped atom. The method can also include selecting a substrate for use in the single molecule switch based at least in part on one or more switching properties of the endohedral fullerene in combination with the substrate, and depositing one or more molecules of the endohedral fullerene on the substrate. Additionally, such a method can include creating a tunneling junction comprising the substrate, the endohedral fullerene, and a contact.

To the accomplishment of the foregoing and related ends, certain illustrative aspects of the innovation are described herein in connection with the following description and the annexed drawings. These aspects are indicative, however, of but a few of the various ways in which the principles of the innovation can be employed and the subject innovation is intended to include all such aspects and their equivalents. Other advantages and novel features of the innovation will become apparent from the following detailed description of the innovation when considered in conjunction with the drawings.

DETAILED DESCRIPTION

Figure 1:
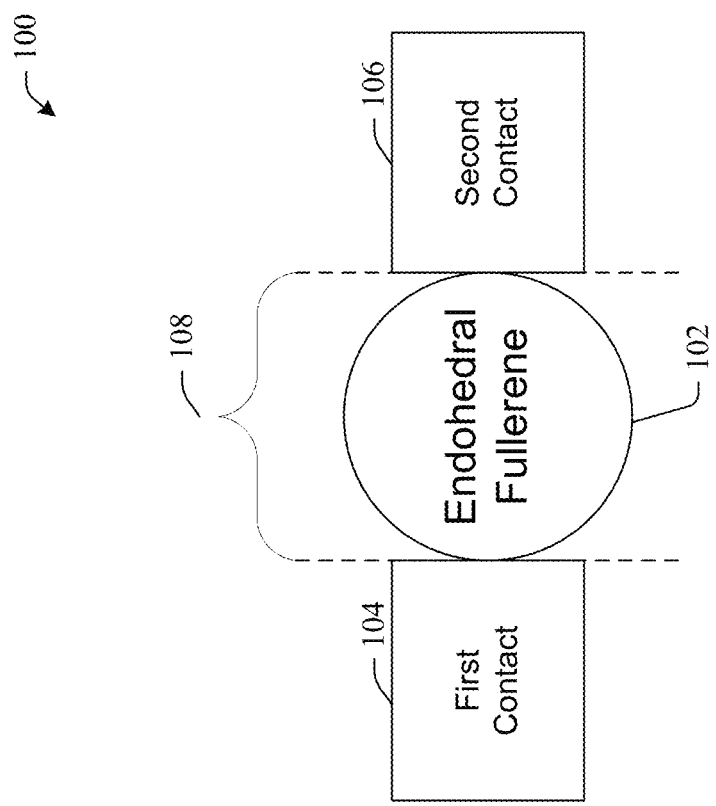
FIG. 1 illustrates a system useable as a single molecule switch in accordance with aspects of the subject innovation.

The innovation is now described with reference to the drawings, wherein like reference numerals are used to refer to like elements throughout. In the following description, for purposes of explanation, numerous specific details are set forth in order to provide a thorough understanding of the subject innovation. It may be evident, however, that the innovation can be practiced without these specific details. In other instances, well-known structures and devices are shown in block diagram form in order to facilitate describing the innovation.

In various embodiments, the subject innovation can include systems and methods that employ a molecular switch based on inelastic electron tunneling through hollow molecular cages containing atoms or clusters capable of independent motion (e.g., endohedral fullerenes, etc.) as described herein. Additionally, although, for ease of reference, the term "fullerene" is used herein, this term as used herein encompasses other similar molecules than purely carbon fullerenes, such as carbon fullerenes with one or more (or all) carbon atoms substituted with other atoms, boron nitride fullerenes, etc. Some embodiments can use a hierarchical molecular switch based on the inelastic-electron-scattering driven rotation of an endohedral molecular cluster $Sc_3N$ among six distinct stationary states within a $C_{80}$ fullerene cage. Other embodiments can employ a molecular switch based on inelastic electron tunneling through oscillation or translation of an internal atom (e.g., Li atom, etc.) localized resonance in a fullerene (e.g., $C_{60}$), such as $Li@C_{60}$ (wherein the @ notation indicates that the atom, cluster, etc. to the left of the @ is inside that to the right of the @ sign; thus, $Li@C_{60}$ indicates a lithium atom trapped inside buckminsterfullerene, etc.).

In aspects, the subject innovation includes systems and methods that employ single molecule switching devices based on endohedral fullerenes. In various aspects, the subject innovation can employ a metal-nitride cluster fullerene as the endohedral fullerene in a single molecule switching device. Experimental and theoretical results discussed herein demonstrate a single molecule switch based on tunneling electron-driven rotation of a specific metal-nitride cluster fullerene, a triangular $Sc_3N$ cluster within an icosahedral $C_{80}$ fullerene cage, among three sets of enantiomorphic configurations. Scanning tunneling microscopy imaging of switching within single molecules and electronic structure theory identify the conformational isomers and their isomerization pathways. Bias-dependent action spectra and modeling implicate the antisymmetric stretch vibration of $Sc_3N$ cluster as the gateway for energy transfer from tunneling electrons to the cluster rotation. Hierarchical switching of conductivity through the internal cluster motion among multiple stationary states while maintaining a constant shape is advantageous for the integration of endohedral fullerene-based single-molecule memory and logic devices into parallel molecular computing architectures.

Fullerenes are a particularly promising family of molecules for molecular switching devices, with invariant morphology and chemically stable structures. Because of their rigid, geodesic molecular structure consisting of a uniform all-carbon shell, fullerenes are very stable and their structure is ideally suited for high-density integration. Molecular transistors and rectifiers based on single fullerene molecules work on well-established principles. Extrinsic switches based on the oscillatory mechanical translation of single $C_{60}$ molecules at THz frequencies between two electrodes have been demonstrated experimentally and explained by theory. Other experimental achievements such as the reversible dimerization and the rotation of fullerenes within the STM junction provide further mechanisms for the actuation of single fullerene switches.

A further advantageous property of fullerenes is their inner space protected by the carbon cage with respect to chemical interaction and perturbation by applied electrical fields akin to a Faraday cage. The endohedral doping of fullerenes by atomic or cluster inclusions introduces additional conformational, chemical, electrical, and magnetic degrees-of-freedom that can confer particular functions to a single molecular device. Soon after the discovery of fullerenes, it was proposed that the endohedral fullerenes could serve as switching devices if the encapsulated moiety could be moved in a controlled manner between two stable positions inside the cage. By combining electronic structure calculations with dynamical simulations, such current-triggered dynamics were studied in an Au—$Li@C_{60}$—Au junction, as discussed below and in Jorn, R.; Zhao, J.; Petek, H.; Seideman, T. Current-Driven Dynamics in Molecular Junctions Endohedral Fullerenes, *ACS Nano*, 2011, 5 (10), pp 7858-7865, the entirety of which is incorporated herein by reference. The results showed that in addition to the center-of-mass motion of the fullerene cage, it is possible to actuate much faster large amplitude oscillation of internal Li atom vibration. The mechanism of actuation is based on charge transfer form Au electrode to $Li^+$, leading to the transient occupation of the Li 2s state hybridized with the fullerene s-symmetry superatom state, which favors translation from the wall of fullerene cage, where $Li^+$ is located, to its center, where Li atom is stabilized. In aspects, systems and methods of the subject innovation can employ an endohedral fullerene switch as described herein, for example, an endohedral fullerene switch based on current-driven rotation of metal-nitride cluster (e.g., an $Sc_3N$ cluster) within a $C_{80}$ cage (e.g., $Sc_3N@C_{80}$). In results discussed below, deterministic switching among six ground states was demonstrated by vibrational and electronic excitation of single molecules ($Sc_3N@C_{80}$, in the experimental results discussed below) by inelastic electron tunneling from an STM tip. The single $Sc_3N@C_{80}$ molecule switch discussed below was studied as a prototype for a new class of single molecule devices based on metal-nitride cluster fullerenes. Experimental and theoretical results discussed below analyze the switching behavior in single $Sc_3N@C_{80}$ molecules, which reveal the mechanism for the current-switching of endohedral cluster motion in a surface-molecule-STM junction.

In aspects, the subject innovation can provide for protected multi-state switching with no external moving parts within an endohedral fullerene molecule (e.g., $Li@C60$, $M_xSc_{3-x}N@C_{80}$, such as $Sc_3N@C_{80}$, etc.). In various embodiments, the switching can involve hierarchical multiple-axis rotation of equilateral triangle-shaped metal-nitride clusters (e.g., $Sc_3N$, $Er_3N$, $Y_3N$, $Lu_3N$, $Gd_3N$, clusters with more than one such metal, e.g., an $M_xSc_{3-x}N$ cluster, such as an $Er_xSc_{3-x}N$ cluster, etc.) within a fullerene cage (e.g., icosahedral $C_{80}$ molecule, etc.). Inelastic scattering of tunneling electrons induces the in- and out-of-plane rotations of the cluster (e.g., $Sc_3N$ cluster, etc.) between one or more pairs of chiral conformations (for $Sc_3N$, three such pairs are discussed herein). The nearly-spherical carbon shell offers a structurally and chemically stable interface for the integration of molecular switches into parallel architectures.

Referring initially to the drawings, FIG. 1 illustrates a system 100 useable as a single molecule switch in accordance with aspects of the subject innovation. System 100 can comprise an endohedral fullerene 102 that includes a trapped or enclosed cluster (or atom, etc.) such as those described herein (e.g., a nitride cluster fullerene such as $Sc_3N@C_{80}$, etc., an atom trapped or enclosed in a fullerene such as $Li@C_{60}$, etc.). Endohedral fullerene 102 can be sandwiched between two or more contacts 104 (which can be a lead, substrate, scanning tunneling microscope (STM) tip, molecular wire contacted by chemical bonds to the fullerene cage, etc.) and 106 to form a tunneling junction (in various aspects, three or more contacts can be used; for example, voltage applied to a first contact can cause switching of current between a second contact and a third contact, etc.). In various aspects, one or both of contact 104 and contact 106 can be atomically ordered or otherwise prepared (e.g., as an STM tip, etc.) to allow switching to be controlled in a predictable manner, etc. Although endohedral fullerene 102 is shown in FIG. 1 as occupying the entire gap 108 between contact 104 and contact 106, in various embodiments, endohedral fullerene 102 may only be in chemical contact with either contact 104 or contact 106 (e.g., in chemical contact with a substrate but not with an STM tip, or with one metallic lead but not another, etc.), although in some embodiments, endohedral fullerene 102 can be in chemical contact with both contact 104 and contact 106. As a tunneling current is applied across the junction, motions of the enclosed cluster (atom, etc.) can be stimulated (e.g., rotational, stretching, translational such as shuttling, etc.) as described in greater detail herein, changing the conductance of the endohedral fullerene 102, as described below. By controlling the conductance of the endohedral fullerene 102 in ways described herein using techniques described herein, system 100 can be employed as a single-molecule switch that undergoes minimal structural change, exhibits strong chemical stability with respect to switching, and is highly resistant to environmental perturbations.

Figure 2:
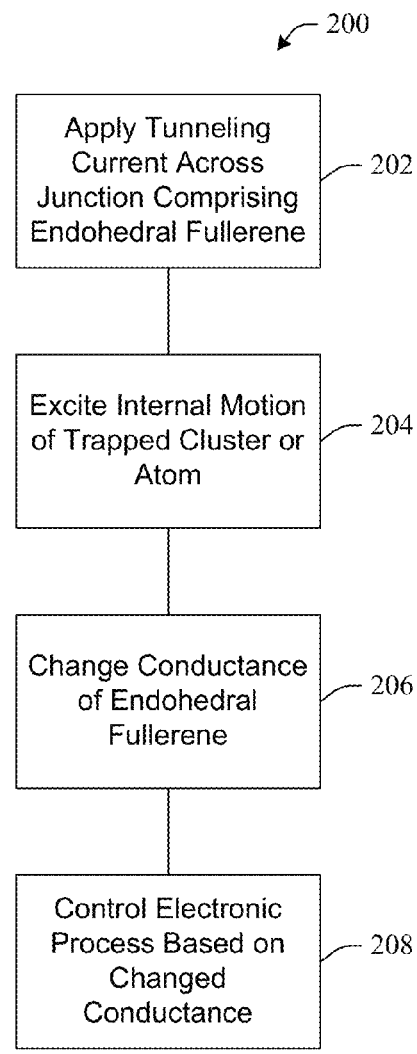
FIG. 2 illustrates of employing a single molecule switch in accordance with aspects of the subject innovation.

Turning to FIG. 2, illustrated is a method 200 of employing a single molecule switch in accordance with aspects of the subject innovation. While, for purposes of simplicity of explanation, the one or more methodologies shown herein, e.g., in the form of a flow chart, are shown and described as a series of acts, it is to be understood and appreciated that the subject innovation is not limited by the order of acts, as some acts may, in accordance with the innovation, occur in a different order and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the innovation.

Method 200 can begin at 202 by applying a tunneling current across a tunneling junction comprising an endohedral fullerene, which includes a trapped cluster (or atom, etc.). At 204, one or more internal motions of the trapped cluster (or atom, etc.) can be excited, such as one of the switching patterns between or among various structures (e.g., between enantiomorphs, between interconverting pairs of enantiomorphs, among structures that are not enantiomorphs of one another, etc.) described herein, or similar motions of other nitride cluster fullerenes, or translational motions described below, etc. Various switching patterns or other specific motions of the trapped cluster (or atom, etc.) can be specifically selected as described herein, based on factors such as material choices, configuration, applied potential, etc. At 206, the conductance of the endohedral fullerene can be changed in a selectable manner via the stimulated internal motion of the trapped cluster (or atom, etc.) within the endohedral fullerene. At 208, the tunneling junction can be employed to control some other electronic process based on the changed conductance of the endohedral fullerene, for example by employing the junction in or as a logic device, in or as memory, etc.

Figure 3:
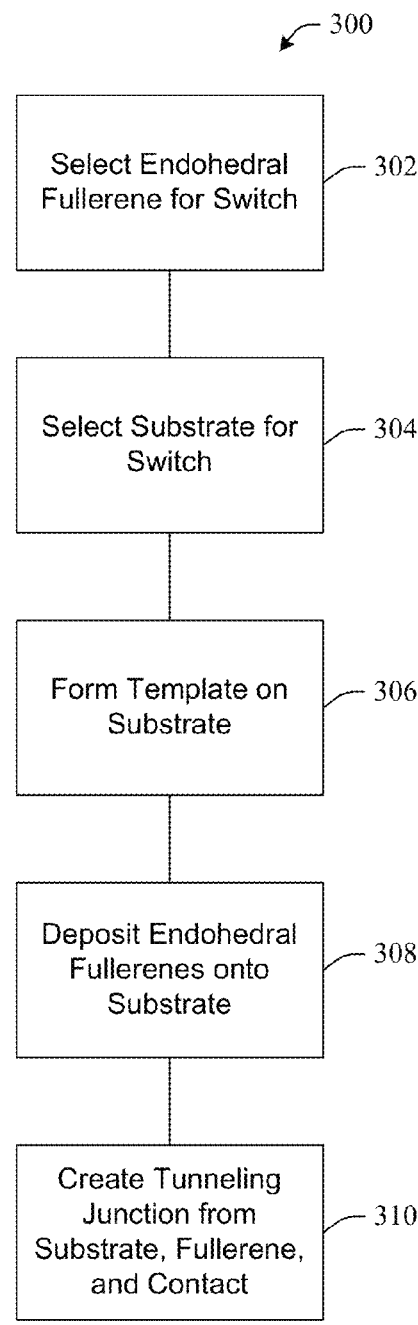
FIG. 3 illustrates of constructing a single molecule switch in accordance with aspects of the subject innovation.

FIG. 3 illustrates a method 300 of constructing one or more single molecule switches in accordance with aspects of the subject innovation. Method 300 can begin at 302 by selecting an endohedral fullerene (e.g., any described herein, etc.) for use in the single molecule switch, which can be based on switching properties of the endohedral fullerene. At 304, the method can include selecting an atomically ordered substrate (e.g., the Cu(110)-(2×1)-O substrate used in experimental results herein, or other substrates, for example, to select for other characteristics of the single molecule switch to be created, etc.), which can be based on the properties of the substrate, and how the properties of the endohedral fullerene will alter when in chemical contact with the substrate. At 306, optionally, a template can be formed on the substrate, which can control later deposition of endohedral fullerenes onto the substrate. At 308, endohedral fullerenes can be deposited onto the substrate using any of a variety of deposition processes (e.g., thermal, kinetic, etc.). If a template was formed, deposition can proceed under controlled conditions (e.g. surface temperature, etc.) to pattern the assembly of molecules according to the established template, so as to control adsorption of endohedral fullerenes onto the substrate and achieve uniformity. At 310, a tunneling junction can be created comprising the substrate, endohedral fullerene, and a contact brought into proximity with the endohedral fullerene (e.g., chemical contact, or to otherwise affect electronic dynamics of the trapped cluster or atom, etc.).

What follows is a more detailed discussion of certain systems, methods, and apparatuses associated with aspects of the subject innovation. To aid in the understanding of aspects of the subject innovation, theoretical analysis and experimental results associated with specific experiments that were conducted are discussed herein. However, although for the purposes of obtaining the results discussed herein, specific choices were made as to the selection of various aspects of the experiments and associated setups—such as materials (e.g., for fullerene, trapped atom or cluster, substrate, junction, etc.)—the systems and methods described herein can be employed in other contexts, as well. For example, various aspects of the subject innovation can be utilized as a single molecule switch, for example, in a logic gate, a memory device, etc. In some embodiments, different selections of materials, configurations, or applications can be selected than those used in the experiments discussed herein, and may have differing characteristics, as explained in greater detail below.

As noted, aspects of the subject innovation employ single molecule switching devices based on metal-nitride fullerene clusters. In 1999, a new family of endohedral fullerenes encapsulating trimetallic nitride clusters, $Er_xSc_{3-x}N@C_{80}$ (where x=0-3), was synthesized by introducing small amounts of nitrogen gas into the electric-arc reactor during vaporization of graphite rods doped with metal oxides. Various nitride cluster fullerenes (NCFs) with different cage sizes and cluster compositions have been synthesized, identified, and isolated; their structural, optical, and electronic properties have been systematically characterized by X-ray diffraction, optical, IR, Raman, NMR, and ESR spectroscopy, electrochemical methods, as well as theory. $Sc_3N@C_{80}$ is the most abundant endohedral fullerene product of the NCF synthesis, although neither the $Sc_3N$ cluster nor the $C_{80}$ cage is stable separately. This fullerene is produced as a mixture of the dominant $I_h$ and minority $D_{5h}$ isomers, where the symmetry refers to the fullerene cage. These isomers are chemically distinct and can be separated by chromatographic or chemical techniques.

Figure 4:
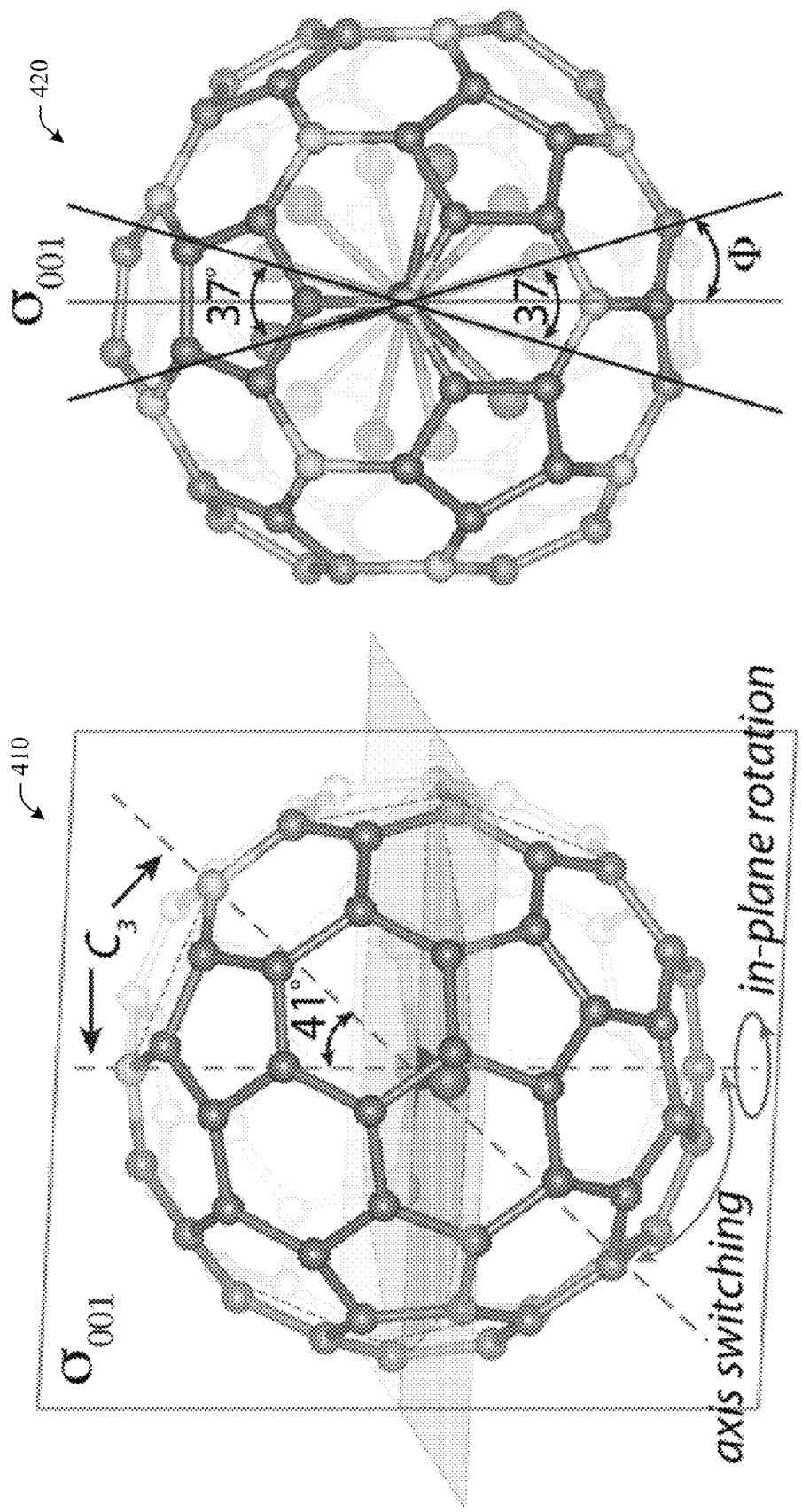
FIG. 4 illustrates the molecular structure, symmetries, and internal motions of $Sc_3N@C_{80}$.

FIG. 4 illustrates the molecular structure and symmetries of $Sc_3N@C_{80}$, showing the $I_h$ isomer. Image 410 shows a perspective view of one of the 40 degenerate minima occupied by the $Sc_3N$ cluster in a free $Sc_3N@C_{80}$ molecule. The $C_3$ symmetry axis of $C_{80}$ cage coincides with the axis for the cluster in-plane hindered rotation passing through the N atom normal to the $Sc_3N$ plane and opposing $C_{666}$ atoms (the atoms which the dashed lines pass through). Two neighboring $C_3$ axes (the dashed lines) with a mutual angle of 41° define a reflection plane of $C_{80}$ ($\sigma_{001}$ as indicated by the square around the molecule), which is a chiral plane with respect to $Sc_3N$. The curved arrows indicate the elementary motions of the $Sc_3N$ cluster, the in-plane rotation and the axis-switching, which interconvert it through a chiral plane (for axis switching, the $C_3$ axes are reflected through a chiral plane (not shown)). Image 420 shows a top view of $Sc_3N@C_{80}$, looking down onto the $Sc_3N$ cluster. The solid line indicates the chiral plane. For each $C_3$ axis, the $Sc_3N$ can adopt four equivalent orientations, corresponding to two chiral pairs (indicated at either end of the curved arrow near 37°) in which an Sc—N bond is rotated by $\Phi=18.5°$ from a chiral plane. Pairs of enantiomers are interconverted by $Sc_3N$ in-plane rotation of 37°.

The $Sc_3N$ cluster and the icosahedral $C_{80}$ cage are stabilized by mutual interaction involving both the electron transfer formally of $6e^-$ from the nitride cluster to the cage and the covalent contributions of the cluster-cage bonding. The $^{13}C$ NMR spectrum recorded at 295 K consists of only two resolved lines corresponding C atoms at the junction of three six-membered rings and the junction of one five-membered ring and two six-membered rings. The NMR results show that at 295 K, the planar $Sc_3N$ cluster exists in an isotropic environment corresponding to the $I_h$ symmetry, suggesting that the $Sc_3N$ cluster rotates rapidly (on the NMR time scale) within the $C_{80}$ cage. This dynamic structure was confirmed by the $^{45}Sc$ NMR spectrum consisting of a single symmetric line.

Long-time (0.7 ns) molecular dynamics simulations quantitatively reproduce the $^{13}$C NMR results for thermally activated rotation. A more precise density functional theory (DFT)-based Born-Oppenheimer molecular dynamics (BOMD) simulation recently done further reveals that Sc$_3$N performs almost free three dimensional (3D) rotation in Sc$_3$N@C$_{80}$ at room temperature. Electron paramagnetic resonance (EPR) and photoluminescence excitation studies also show that for ErSc$_2$N@C$_{80}$, a fullerene with very similar molecular structure to Sc$_3$N@C$_{80}$, the ErSc$_2$N rotor can be switched by light at 532 nm between two stable configurations at 20 K.

The thermally activated internal rotation of the Sc$_3$N cluster suggests that Sc$_3$N@C$_{80}$ molecule may act as a single molecule switch at cryogenic temperatures, where rotation can be stimulated by electrical or optical means. A single Sc$_3$N@C$_{80}$ molecule switch was constructed and its switching behavior was studied in a tunneling junction comprised of the Sc$_3$N@C$_{80}$ molecule sandwiched between the atomically ordered Cu(110)-(2×1)-O (also referred to herein as Cu(110)-O) substrate and the atomically sharp low-temperature scanning tunneling microscope (LT-STM) tip, although in various embodiments, other junctions can be used (e.g., metallic leads, non-metallic conducting or semiconducting leads, other substrate materials, etc.). As shown in image 410 of FIG. 4, the encapsulated equilateral-planar Sc$_3$N cluster sits at the center of the icosahedral C$_{80}$ cage. The cage has 10 equivalent C$_3$ rotational symmetry axes passing through opposing pairs of C atoms, labeled as C$_{666}$, at the vertices of three hexagons. Each pair of nearest-neighbor C$_3$ axes on opposite sides of hexagons lies in a reflection symmetry plane. Within the C$_{80}$ cage, a C$_3$ axis passes through the N atom normal to the Sc$_3$N cluster plane, and a reflection plane of the C$_{80}$ cage containing the same C$_3$ axis cuts the cluster at an angle of ±18.5° relative to the Sc—N bond. For each C$_3$ axis, the Sc$_3$N cluster has four energetically equivalent azimuths as shown at 420; therefore, an isolated Sc$_3$N@C$_{80}$ molecule has 40 energetically equivalent ground state configurations. The elementary transformations of the Sc$_3$N among these equivalent structures can be classified into two types: in-plane rotation by 37° around C$_3$ axis, and axis-switching rotation by 41° between two C$_3$ axes on the opposite sides of a carbon hexagon. Both of these processes interconvert enantiomeric structures. The calculated barriers for the in-plane rotation and axis switching of an isolated, neutral molecule are 74 and 100 meV.

Figure 5:
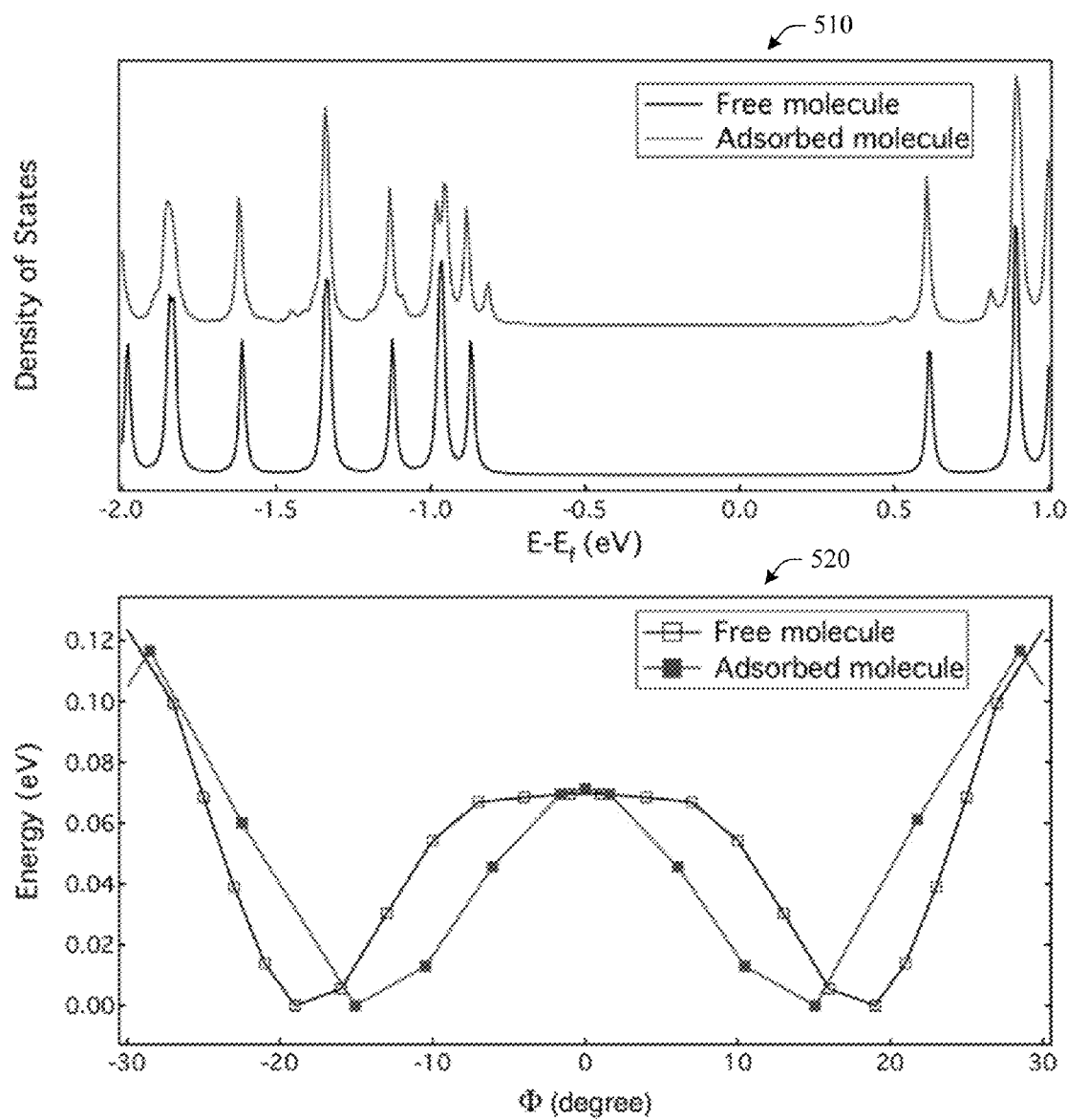
FIG. 5 illustrates the effects of adsorption on the electronic properties of $Sc_3N@C_{80}$ and the energy landscape for the $Sc_3N$ cluster rotation.

To verify whether the chemisorbed Sc$_3$N@C$_{80}$ molecule on the Cu(110)-O surface would have significantly different potential landscape for the elementary transformations, ab initio calculations were performed on both the free and adsorbed Sc$_3$N@C$_{80}$ molecules. FIG. 5 illustrates the effects of adsorption on the electronic properties of Sc$_3$N@C$_{80}$. Graph 510 shows the calculated projected density of states (PDOS) for both free and adsorbed Sc$_3$N@C$_{80}$. The substrate mainly causes the splitting of the highly degenerate electronic states of the free molecule. Graph 520 shows the cross section of the potential energy surface for the in-plane rotation angle of Sc$_3$N calculated for free and adsorbed Sc$_3$N@C$_{80}$. As seen in graph 510, the calculated density of states (DOS) of the free and adsorbed Sc$_3$N@C$_{80}$ have almost the same characteristics. The main perturbation by the surface is to break the I$_h$ symmetry, leading to STM tunneling characteristics that depend on the rotational and azimuthal orientation of the Sc$_3$N cluster. Graph 520 shows the cross sections through the calculated potential energy surfaces (PES) for the in-plane rotation of Sc3N around the normal C$_3$ axis for free and adsorbed Sc$_3$N@C$_{80}$, respectively. The calculated barrier for the in-plane rotation of Sc$_3$N of ~70 meV in the calculation is essentially the same for the free and chemisorbed molecule, and in agreement with a previous study of the free molecule. Because the PES for hindered cluster rotation of the chemisorbed molecule on Cu(110)-O surface is similar to that of the free molecule, the fullerene cage seems to protect the endohedral cluster from strong perturbations by the substrate. Although the potential landscape for switching is weakly affected, the role of the substrate in electronic and vibrational relaxation is unknown.

STM measurements were performed at 4.7 K on individual Sc$_3$N@C$_{80}$ molecules well-dispersed on terraces of the Cu(110)-O substrate. The substrate was highly anisotropic, consisting of atomically perfect Cu—O— chains running in the <001> crystallographic direction. The substrate anisotropy was useful for the symmetry analysis of the switching behavior. The Sc$_3$N@C$_{80}$ molecules can have several different adsorption orientations of the C$_{80}$ cage on the surface. Although most orientations show switching behavior under excitation by the tunneling current, the analysis focused on one subset of molecules with a specific adsorption orientation that exhibits consistent hierarchical multi-level switching behavior among stationary states with distinct symmetry. The same characteristic switching behavior was observed consistently for multiple molecules, and thus it was associated with a subset with a specific chemisorption structure.

Figure 6:
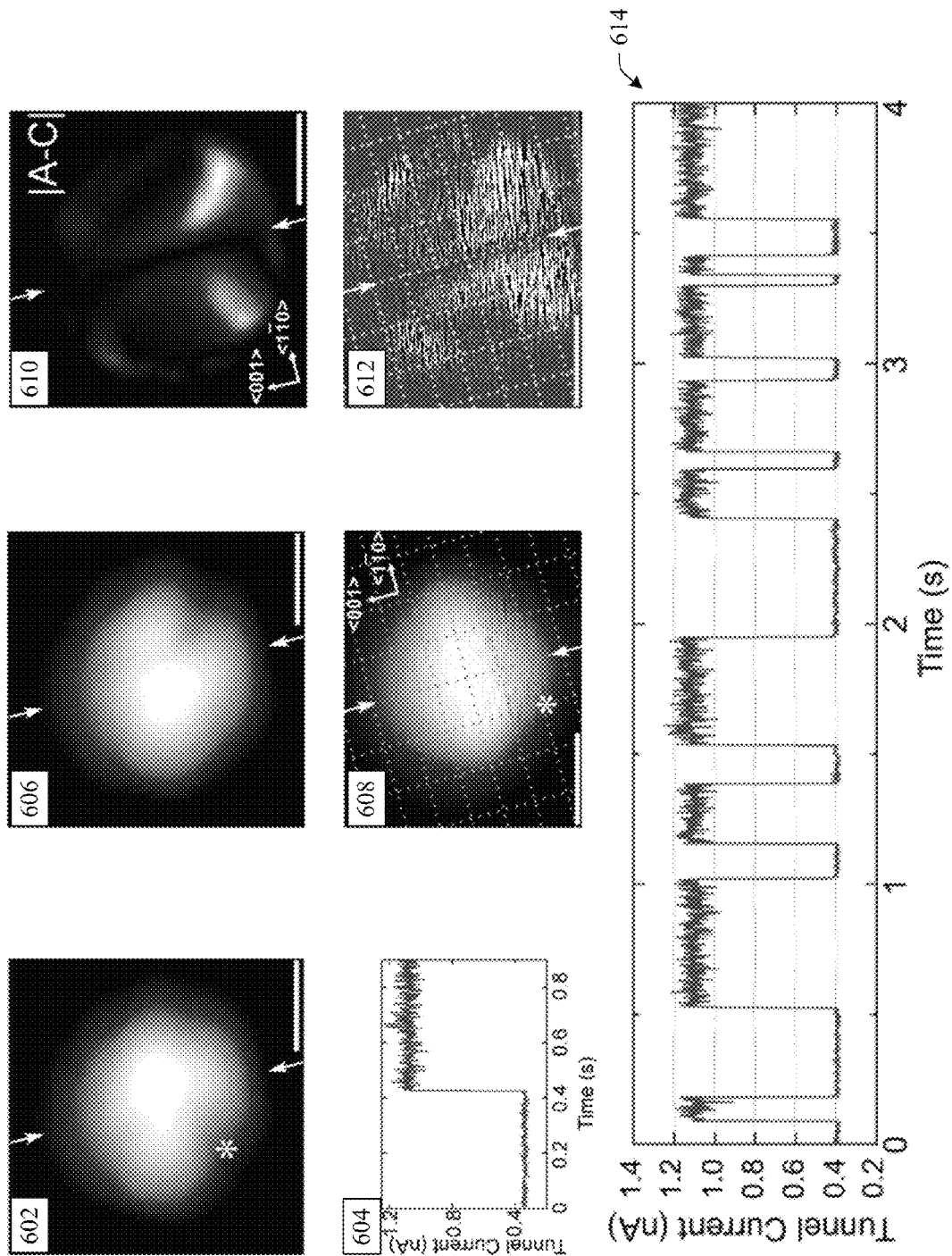
FIG. 6 illustrates tunneling electron stimulated enantiomerization of $Sc_3N@C_{80}$.

FIG. 6 illustrates tunneling electron stimulated enantiomerization of Sc$_3$N@C$_{80}$. At 602 is a topographic STM image of a single Sc$_3$N@C$_{80}$ molecule on Cu(110)-(2×1)-O substrate. The tunneling conditions were V$_{bias}$=50 mV and I$_{setpoint}$=0.1 nA for 602 and 606. The white scale bars correspond to 1 nm in all image frames. Graph 604 shows the tunneling current recorded by applying 100 mV voltage pulse above Sc$_3$N@C$_{80}$ at the position marked by the asterisk in 602. STM image 602 shows apparent distortion from the nearly spherical molecular structure of the C$_{80}$ cage, indicating that the internal Sc$_3$N cluster, whose particular orientation subtly affects the molecular conductivity, influences the imaging. Whereas this molecular topography is stable when recording at the bias voltage of 50 mV, a voltage pulse of 100 mV at the position marked with an asterisk in 602 switches the local conductivity from a low to high state, as shown in 604. After the sudden jump in the tunneling current, imaging the same molecule at 50 mV bias reveals that switching converted the topography in 602 into its mirror image in 606. Image 608 shows the same molecule as in 602 and 606 recorded at V$_{bias}$=100 mV and I$_{setpoint}$=0.4 nA; the image becomes symmetric because of fast enantiomerization during the imaging process. The arrows in the images indicate the σ$_{001}$ mirror plane, and the dotted line meshes in 608 and 612 indicate the substrate lattice. The absolute value of the difference between topographs in 602 and 606 is computed and presented in 610. The difference pattern exhibits a mirror symmetry σ$_{001}$ with respect to a surface normal plane parallel to the <001> crystallographic direction of the substrate, demonstrating the enantiomorphic relationship of the two configurations. At the mirror symmetry plane, the molecular conductivity does not change upon switching between enantiomorphic states.

Imaging the same molecule at 100 mV results in a symmetric, near spherical image shown at 608. A current versus time (I–t) trend recorded at 100 mV under open feedback loop conditions above the asterisk shows tunneling current switching between two stationary states, as seen in 614. The I–t trend is modulated by telegraph noise (random bistable current switching behavior), which indicates that the STM topography in 608 is actually a superposition of two enantiomorphic images rendered symmetric by stochastic interconversion between two energetically equivalent structures during the imaging process. The switching behavior was attributed to the tunneling current induced rotation of the $Sc_3N$ cluster within the $C_{80}$ cage, because the cage itself and the adsorption site are expected to be stable, whereas the cluster is known to undergo thermally induced internal rotation. At 4.7 K, the thermal rotation of the cluster is quenched. The switching rate does not depend on the applied field of the STM tip, which is expected to be screened by the $C_{80}$ cage. As shown in detail below, there is a clear onset of switching between 50 and 100 mV, suggesting that transfer of energy from tunneling electrons to the molecular vibrations actuates it.

Processing image 608 with a high-pass filter to remove the topographic information maps the spatial distribution of the switching amplitude (difference between the low and high current) over the molecule. This switching pattern (SP) shown in 612 is related to and resembles the contrast in the difference pattern in 610; it is characteristic of the rotational and azimuthal orientation of both the cage with respect to the substrate and the cluster with respect to the cage. Such SPs allow for selection of the particular subset of molecules that possess constant $C_{80}$ shell chemisorption structure and characteristic switching properties of the $Sc_3N$ cluster. Furthermore, within this subset the SPs can facilitate identification and classification of the different switching processes involving the rotation of the $Sc_3N$ cluster among multiple stationary states.

Figure 7:
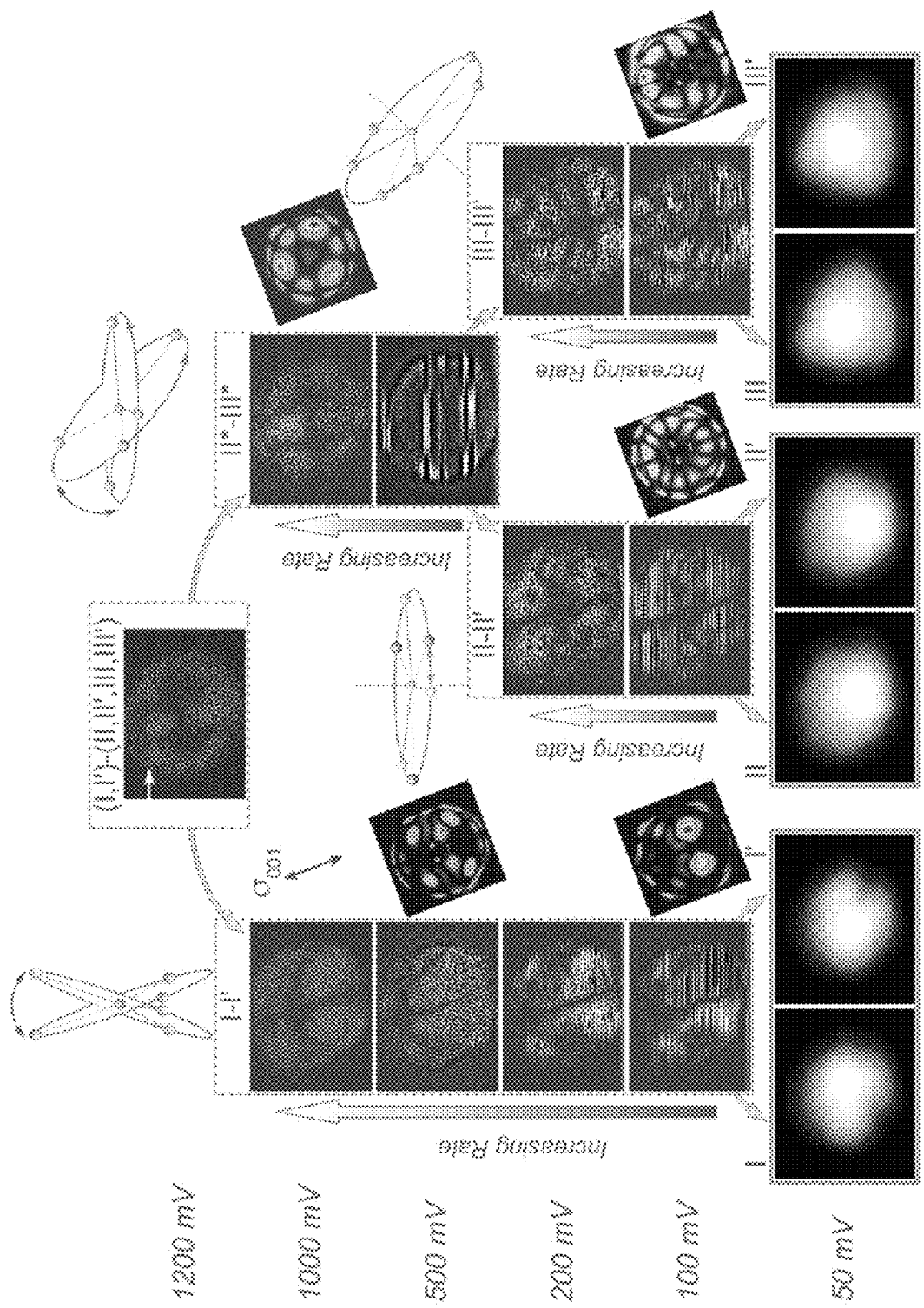
FIG. 7 illustrates the hierarchical switching processes in $Sc_3N@C_{80}$ and the identification of the associated $Sc_3N$ motions.

FIG. 7 illustrates the hierarchical switching processes in $Sc_3N@C_{80}$ and the identification of the associated $Sc_3N$ motions. For the selected chemisorption structure of $Sc_3N@C_{80}$ molecule, six stable configurations were found, comprising three enantiomorphic pairs, labeled (I, I'), (II, II') and (III, III'), as seen at the bottom of FIG. 7. The primary switching between chiral pairs (I$\leftrightarrow$I'), (II$\leftrightarrow$II') and (III$\leftrightarrow$III') sets in above 100 mV, as indicated by the corresponding characteristic SPs in FIG. 7. Note that each SP shows a node for the switching amplitude in the $\sigma_{001}$ mirror symmetry plane, as expected for the interconversion of enantiomers. The evolution of the SPs with increasing bias voltage from 100 to 1200 mV traces a reproducible hierarchical switching behavior associated with this particular chemisorption structure of $Sc_3N@C_{80}$. Depending on the initial configuration of $Sc_3N@C_{80}$, switching to other configurations requires specific bias voltage. For example, primary switching process I-I' is observed up to a bias voltage of 1200 mV; the characteristic switching pattern $SP_I$ has a constant spatial distribution over the molecule, but the click rate increases with applied voltage. The switching patterns $SP_{II}$ and $SP_{III}$ for switching events II-II' and III-III', respectively, also persist with increasing click rate up to 500 mV. Above 500 mV the switching rates of the elementary processes are too fast to resolve with the STM. A change can be deduced in the switching behavior, however, because a new switching process with a characteristic switching pattern and lower switching rate emerges. This new process interconverts II, II', III, and III', however, it can be viewed as bi-state switching between II* and III*, where the asterisk designates the averaged configurations of rapidly (on the time scale of the II*-III* process) interconverting pairs II-II' and III-III'. Switching process between I or I' to the other four (II, II', III, III') configurations, as well as the reverse process, has an even higher threshold of ~1200 mV.

Increasing the bias (the vertical direction in FIG. 7) actuates the switching with characteristic SPs recorded at different bias voltages on the same $Sc_3N@C_{80}$ molecule. The curved arrows at specific voltages indicate onsets of switching between different configurations. The vertical arrows convey the increasing rate of specific switching processes at higher voltages. The SPs reveal the evolution with increasing bias voltage of the switching from enantiomeric configurations, with a node of the switching amplitude in the $\sigma_{001}$ mirror plane, to non-enantiomeric ones without a node. Note that the switching between (I, I') and (II, II', III, III') with a threshold above 1000 mV is so slow that it appears only once in the SP at 1200 mV, at the instant indicated by the arrow. The most consistent simulated SPs together with the corresponding schematic diagrams illustrate the $Sc_3N$ cluster motions for four different switching processes.

It was postulated that the primary switching processes, which interconvert the chiral pairs with <100 mV threshold voltages, involve the elementary motions. Notably, the SPs interconverting the enantiomers possess the $\sigma_{001}$ symmetry. This characteristic feature constrains both the orientation of the $C_{80}$ cage on the surface and the possible motions of the $Sc_3N$ cluster within it. To satisfy the symmetry constraint the molecule must chemisorb in an orientation such that the $C_{80}$ cage has the $\rho_{001}$ reflection plane perpendicular to the surface and passing through a Cu—O— chain. The transformations of the $Sc_3N$ with respect to the cage are also constrained to the two processes shown in FIG. 4, i.e., either the in-plane rotation around a $C_3$ axis that lies in the $\sigma_{001}$ plane, or axis-switching rotation between $C_3$ axes that are related by reflection in the $\sigma_{001}$ plane.

Figure 8:
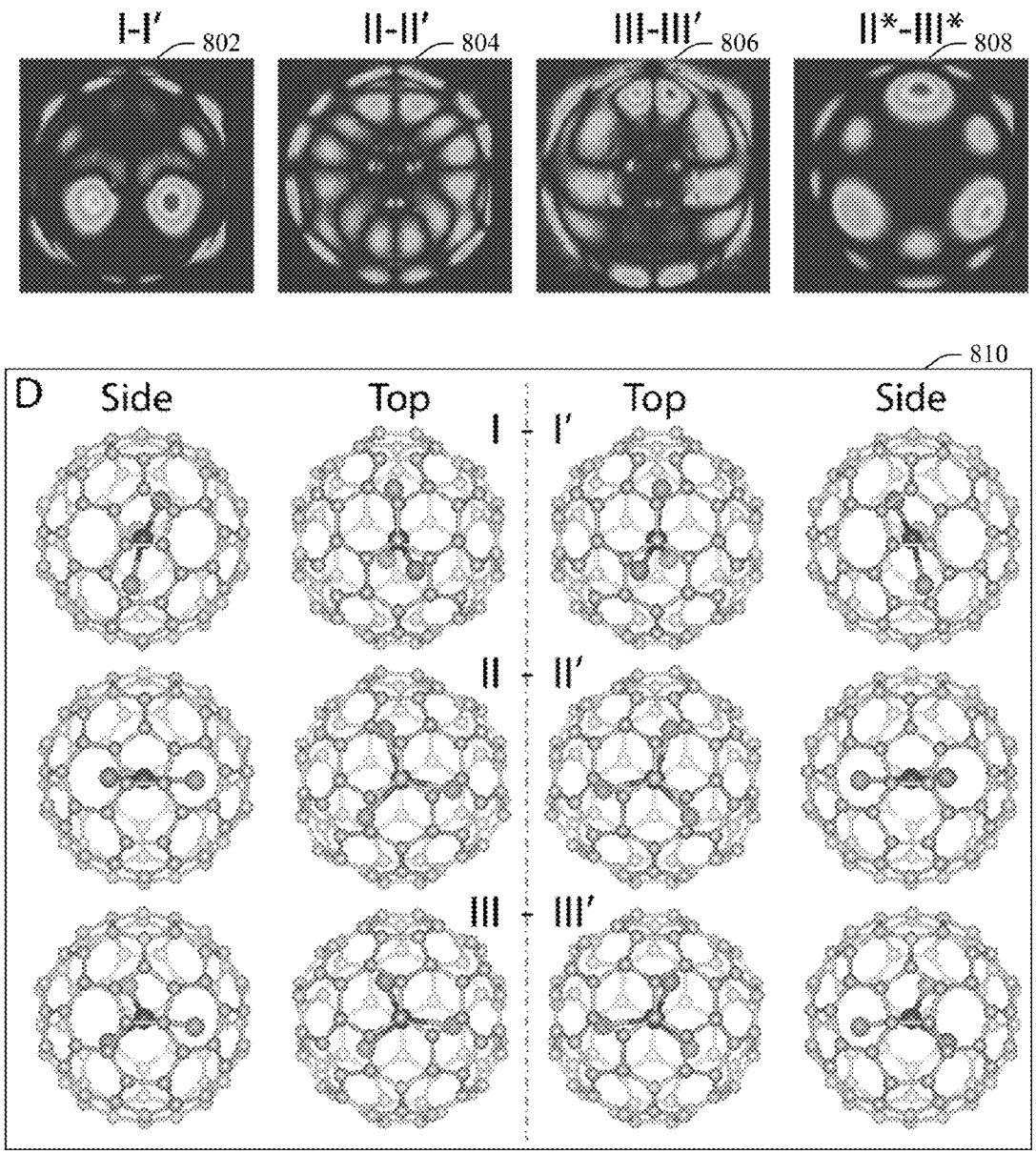
FIG. 8 illustrates simulated switching patterns of $Sc_3N$ cluster motions and top and side views of the six interconverting enantiomorphic structures.

To make more specific assignments, ab initio calculations were performed on free and chemisorbed $Sc_3N@C_{80}$ molecules for structures with different $Sc_3N$ orientations that satisfy the symmetry restrictions. The calculations provide the electronic structure and simulated STM images of $Sc_3N@C_{80}$ molecules. From the simulated STM images of the enantiomers, the theoretical SPs were obtained by taking the absolute value of their difference. The $Sc_3N$ motions associated with the switching events were determined by comparing the simulated and experimental SPs. FIG. 8 illustrates simulated SPs of the associated cluster motions at 802-808 and top and side views of the six interconverting enantiomorphic structures in box 810. The simulated SPs that were most consistent with the experimental ones as well as the corresponding geodesic models illustrating the $Sc_3N$ motions are also listed in FIG. 7. Based on the comparison between the experimental and calculated SPs it was concluded that $Sc_3N@C_{80}$ molecules responsible for the switching behavior adsorb with a $C_{666}$ atom facing downward and oriented with a mirror plane parallel to the <001> crystallographic direction. Furthermore, $SP_I$ was assigned to $C_3$ axis-switching of $Sc_3N$ between nearly vertical alignments; $SP_{II}$ to an in-plane rotation of $Sc_3N$ parallel to the substrate; and $SP_{III}$ to an in-plane rotation about a $C_3$ axis that is tilted by 41° from the normal in the $\sigma_{001}$ plane. Consequently, the (II*)-(III*) process is an achiral axis-switching of a $C_3$ axis from the normal to the 41° tilted alignment within the $\sigma_{001}$ plane. This is consistent with its SP in FIG. 7 having maxima rather than a node in the mirror plane. The switching from (I, I') to either (II, II') or (III, III') is a non-elementary process that can occur through two successive axis switching steps of 41° between the next-nearest neighbor $C_3$ axes.

Further information about how these cluster motions are actuated was obtained by recording I–t trends, which are often used to study tunneling electron-induced surface dynamical processes. By monitoring the tunneling current above a single $Sc_3N@C_{80}$ molecule the number of cluster configurations active at a particular voltage and the switching rate among them was deduced.

Figure 9:
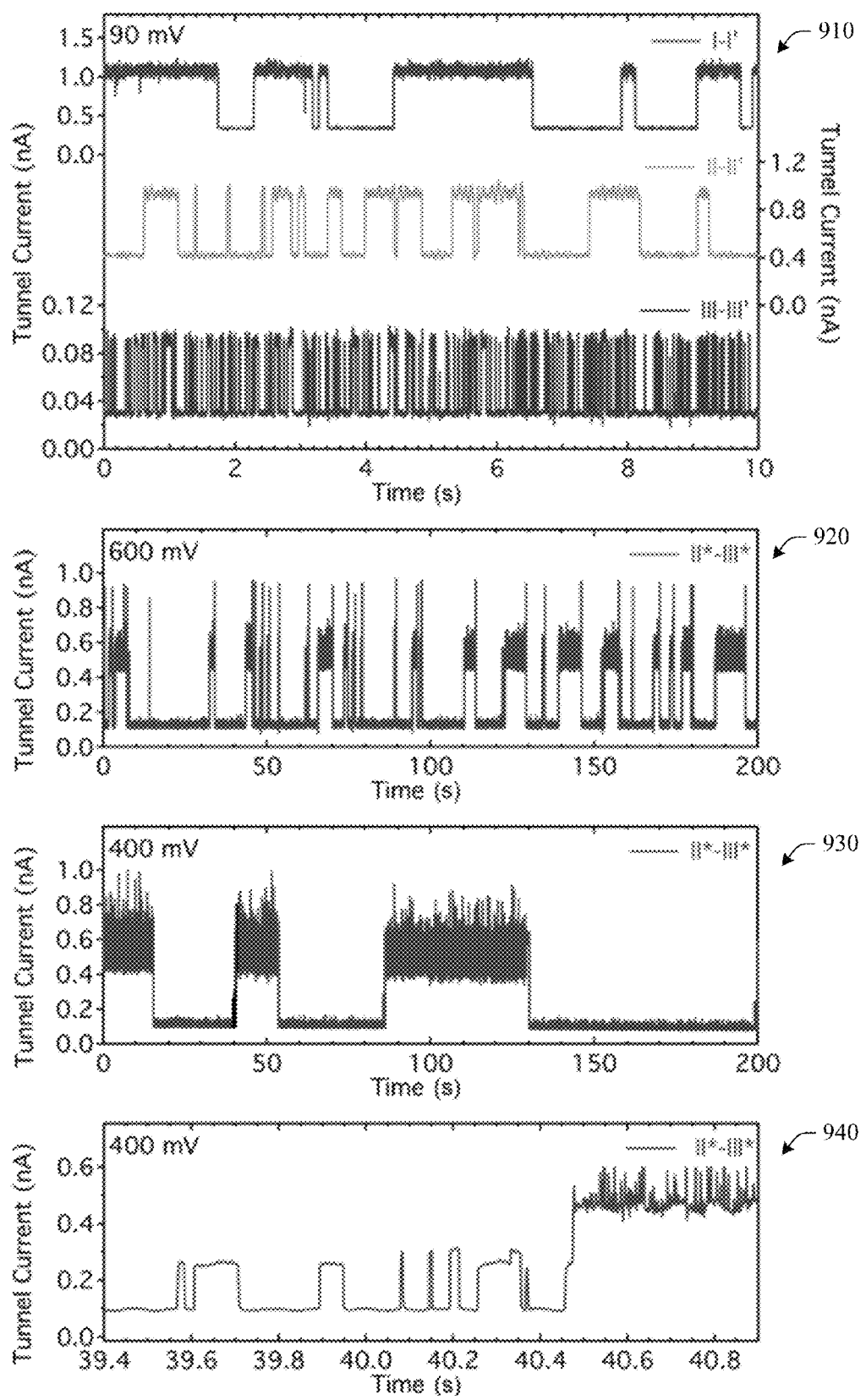
FIG. 9 illustrates current-time trends of telegraph noise resulting from all four switching processes for $Sc_3N@C_{80}$.

FIG. 9 illustrates I–t trends of telegraph noise resulting from all four switching processes for $Sc_3N@C_{80}$, I-I', II-II', III-III', II*-III*, with the tip located above the part of molecule showing largest current changes. From graph 910, which shows three primary switching processes at $V_{bias}$=90 mV, it is clear that only two stationary states, representing the two stable enantiomeric configurations, are involved in each switching process. At the same bias voltage of 90 mV, the switching rates are different for the three processes. It is evident from 910 that, at much smaller tunneling current, i.e., for a smaller dose of tunneling electrons, the switching clearly has a higher rate than I-I' and II-II', implying a higher switching yield. In contrast to the I–t trends for three primary switching processes, which are characterized by simple telegraph noise behavior, I–t trend for the II*-III* switching in graphs 920 (at 600 mV) and 930 (at 400 mV) always has a spike-like feature right before the switching happens. A detailed look of these spike-like features in graph 940 shows the existence of multiple transient states. This analysis indicates that although II*-III* corresponds to a process of an achiral axis-switching from the normal to the 41° tilted alignment, the actual switching process is more complicated and involves multiple metastable molecular configurations.

Figure 10:
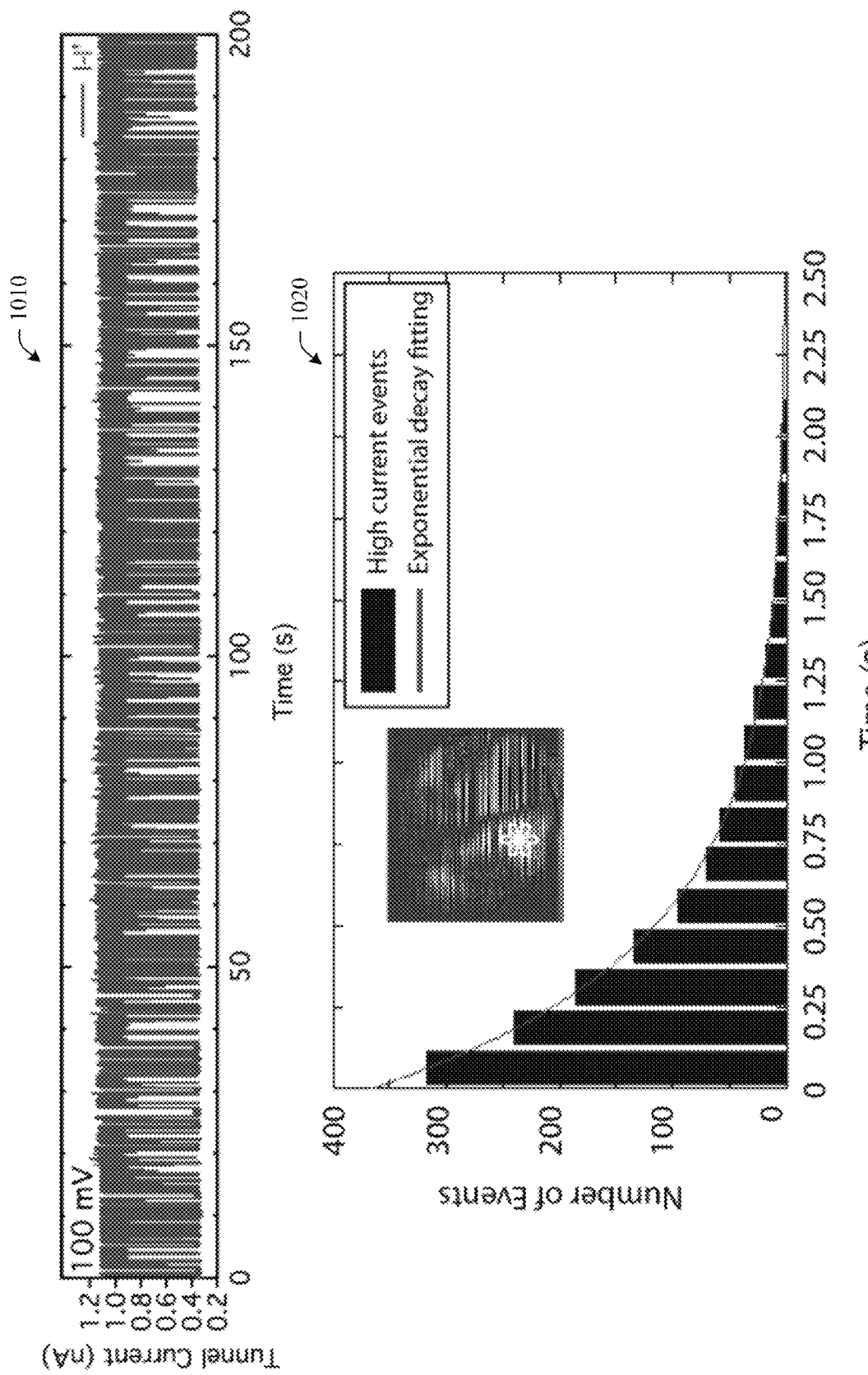
FIG. 10 illustrates extraction of switching quantum yields from current-time trends.

Detailed statistical analysis of the I–t traces provides quantitative information on the tunneling electron induced dynamical process that can be used to construct a model for the switching mechanism. The residence times of the molecule in the high conductance state is directly related to the switching quantum yield. If the switching probability follows the Poisson statistics with respect to the tunneling current, the residence times in a configuration should be distributed exponentially with a characteristic time. FIG. 10 illustrates extraction of the switching quantum yields (Y) from the I–t trends. Graph 1010 shows a 200 s I–t trend corresponding to 315 events for I-I' switching recorded at $V_{bias}$=100 mV. The STM electronics used in the experiment limited recording of switching rates to below 800 s$^{-1}$. Graph 1020 shows the distribution of the residence times from the I–t trace in graph 1010 as a histogram of residence times in the high-conductance state for the I–t trend in A with a time bin width of 0.125 s. The nth column indicates the number of events with a lifetime longer than n*0.125 s. Fitting the data with an exponential function gives the time constant (τ) of 0.436 s. The inset in graph 1020 shows an experimental SP with an asterisk indicating the position where the I–t trend was recorded. As seen in graph 1020, the residence times are well described by an exponential distribution, which is modeled by n=A exp (−t/τ), where n is the number of switching events, t is the residence time, and τ is the time constant. The switching quantum yield, i.e., number of switching events per tunneling electron, is then given by Y=e/(I*τ), where e is the electron charge and I the tunneling current. The quantum yield of the switching process as a function of bias voltage, also called action spectrum, can be obtained by analyzing I–t trends measured at various bias voltages. Such analyses were performed for all four switching processes.

Figure 11:
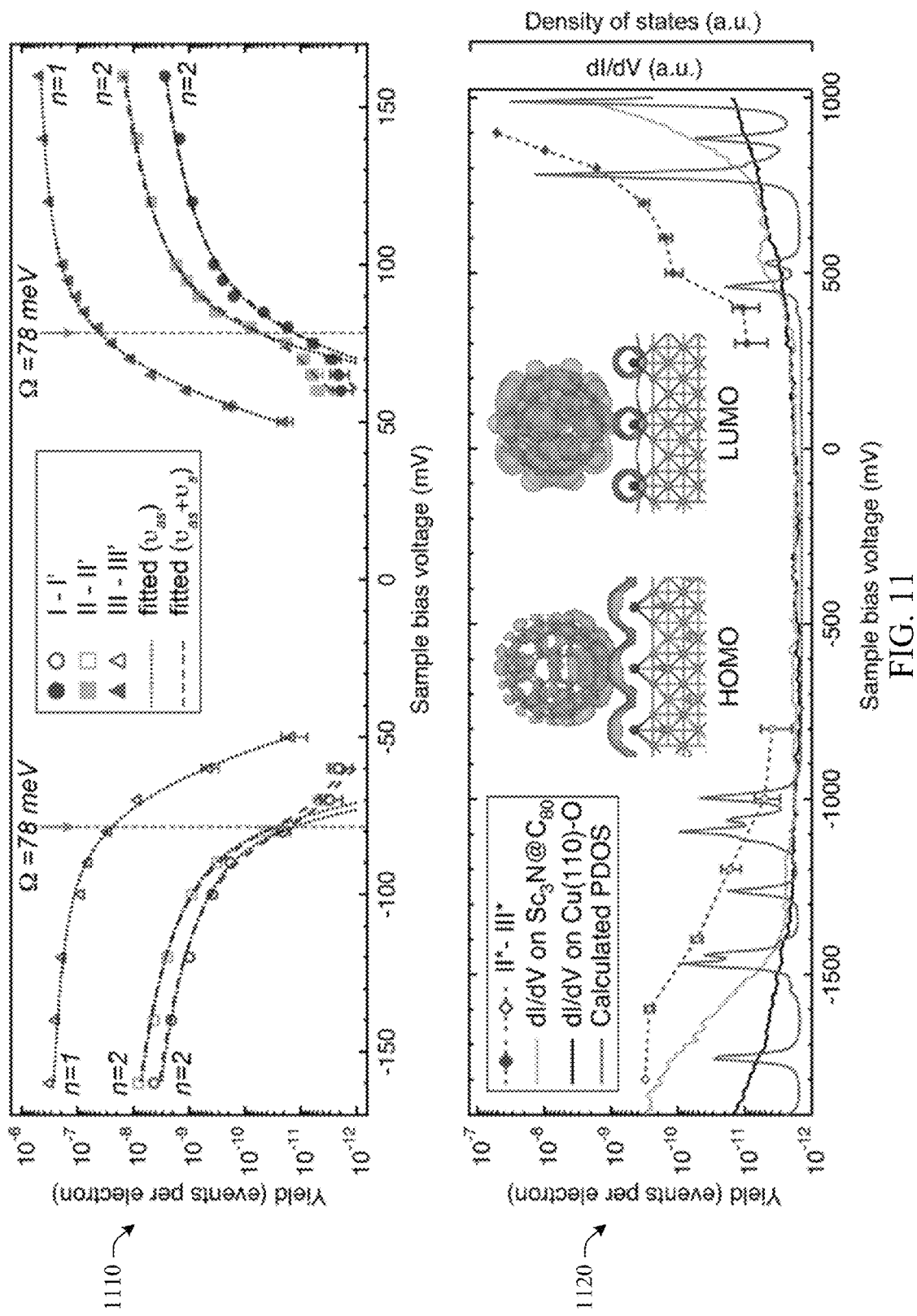
FIG. 11 illustrates quantum yields as a function of tunneling bias voltage for the switching processes of $Sc_3N@C_{80}$.

FIG. 11 illustrates quantum yields as a function of tunneling bias voltage for the switching processes of $Sc_3N@C_{80}$. Graph 1110 shows action spectra for processes I-I', II-II' and at both positive and negative bias voltages. The action spectra clearly show that all three elementary switching processes are bias polarity independent, with quantum yields rising and saturating in an interval between |50| and |100| mV. Moreover, the process has a qualitatively different action spectrum profile and quantum yields that are about two orders-of-magnitude higher than those of I-I' and II-II'. The dotted curves in 1110 are the best fits to the data including only the antisymmetric stretching mode ($v_{as}$) of the $Sc_3N$ cluster, while the dashed curves are the simulated data assuming coexcitation of the symmetric stretching mode ($v_s$), which reproduces the low-energy tailing data. Best-fit vibrational energies (Ω) and reaction orders (n) are indicated. Graph 1120 shows quantum yield as a function of voltage for the switching process (II*)-(III*) as dashed lines connecting the data points (circles). The experimental dI/dV spectra of $Sc_3N@C_{80}$ (in green) and the substrate (in black), along with the calculated PDOS of $Sc_3N@C_{80}$ (in blue) are shown for comparison. The correspondence between the quantum yields, the molecular dI/dV spectra, and the PDOS implicates isomerization via electronic excitation of $Sc_3N@C_{80}$. The inset shows the calculated HOMO and LUMO orbital densities of the $Sc_3N@C_{80}$ molecule.

Figure 12:
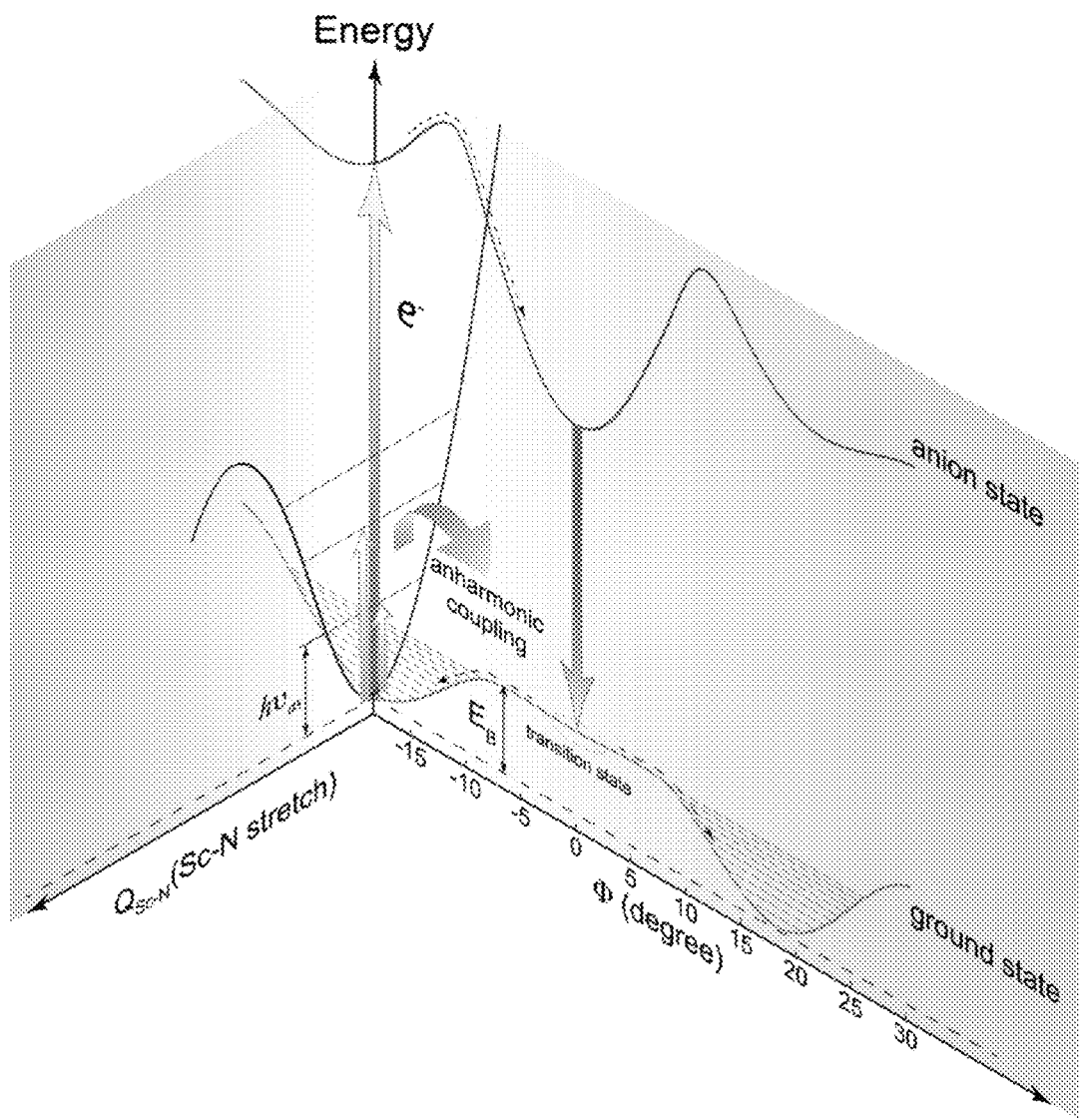
FIG. 12 illustrates a schematic energy diagram for tunneling electron induced isomerization of $Sc_3N@C_{80}$ molecules via inelastic vibrational and electronic processes.

The polarity independent yields and low threshold voltages are consistent with a vibrational excitation mechanism, where the inelastically scattered tunneling electrons excite one or more molecular vibrational modes to energize the cluster rotation. Previous Raman and infrared spectroscopy experiments as well as the quantum-chemical calculations show that the highest frequency experimental (and theoretical values in parentheses) vibrational modes of $Sc_3N$ cluster within $Sc_3N@C_{80}$ are the symmetric ($v_s$) and antisymmetric ($D_{as}$) Sc—N stretching modes at 51 (52) and 74 (79) meV, respectively. Whereas these two stretching modes fall within the threshold range of the action spectra discussed herein, the reaction coordinate (RC) modes, including the frustrated in-plane, $R_z$, and out-of-plane (i.e., axis switching), $R_x$ and $R_y$, rotations of $Sc_3N$ cluster, have much lower frequencies of 10 (13) and 6 (9) meV, respectively. Because both the in-plane and axis-switching rotation elementary processes have energy barriers greater than 70 meV between equivalent conformations of $Sc_3N$ cluster, the switching between them requires excitation of multiple quanta of the RC modes, which is unlikely by inelastic scattering of single electrons. FIG. 12 illustrates a schematic energy diagram for tunneling electron induced isomerization of $Sc_3N@C_{80}$ molecules via inelastic vibrational and electronic processes. The excitation process more likely occurs, as depicted schematically in FIG. 12, through an indirect route, where a high frequency mode, such as the Sc—N stretching vibration, acts as energy acceptor from where intramolecular vibrational redistribution transfers the energy necessary for overcoming the barrier for hindered rotation to multiple quanta of the RC modes. This anharmonic coupling process can be particularly efficient if the energy is localized within the cluster, because coupling between the cluster and the cage is weak. Moreover, the fullerene cage does not have low frequency modes that could couple with the reaction coordinate. Thus, the fullerene cage acts as a barrier to dissipation of energy from the cluster to the environment.

The action spectra in FIG. 11 are a manifestation of such vibrationally mediated intramolecular dynamics, and therefore in principle reflect the excitation and coupling of the participating vibrational modes. Extracting the information on the vibrational dynamics that lead to actuation of the switching process, however, requires a model, which is sufficiently complex to provide understanding with minimal fitting parameters. A possible approach to assign the acceptor vibration modes is to numerically differentiate the log Y(V) spectra and locate the peak position in the d log Y(V)/dV plots. This method, however, is inaccurate for the measurements disclosed herein due to the limited precision and number of data points in the action spectra, especially in the energy region below excitation threshold where the reaction rate is low. In addition, more detailed information such as the reaction order, corresponding to the number of tunneling electrons required to actuate dynamics, is an essential factor, which cannot be obtained from the Y(V) spectra alone, but requires additional measurements of the reaction yield as a function of current. However, these problems are remedied in a model that has been previously developed for describing the chemistry induced by inelastic tunneling electrons via intermediate vibrational-energy acceptor states. Prior work has shown that the dependence of the reaction rate on the applied voltage R(V) can be expressed as equation 1, $$R(V) = k\left(\frac{I_{in}(V)}{e}\right)^n \quad (1)$$

where $I_{in}$ denotes the inelastic tunneling current, and $k=\tau_v/\tau_v$, $_{RC}$ is a rate constant given by the ratio of the transition rate $1/\tau_{v,Rc}$ describing the excitation of the RC mode via anharmonic mode coupling from the acceptor $v$ mode, and the decay rate $1/\tau_v$ of the $v$ mode into the electron-hole pair excitation in substrate. The inelastic current $I_{in}$ vanishes when the energy of tunneling electron, eV, is below the energy of the $v$ mode, $\Omega$, whereas $I_{in}$ increases linearly with the inelastic conductance, $\sigma_{in}$, when eV≥$\Omega$. The second derivative of $I_{in}$ with respect to the bias voltage, $d^2I_{in}/dV^2$, directly reflects the vibrational density of states (DOS), $\rho(\Omega)$. The intrinsic vibrational damping and thermal excitation results in the broadening of $\rho(\Omega)$ and consequently the gradual increase of the slope from 0 to $\sigma_{in}$ near the threshold energy $\Omega$ in $I_{in}(V)$. The main approximation of the model is to use a Gaussian function (GF) to simulate the effective vibrational DOS taking into account of the instrumental, thermal, and lifetime broadening. The $I_{in}(V)$ can therefore be expressed as equation 2, $$I_{in}(V) = \sigma_{in} f(V,\Omega,\gamma)$$

where $f(V,\Omega,\gamma)$ is the double integration of the GF with respect to V, as in equation 3, $$f(V, \Omega, \gamma) = \frac{\gamma}{4\sqrt{\pi \ln 2}} \exp\left(-\frac{4\ln 2\left(V - \frac{\Omega}{e}\right)^2}{\gamma^2}\right) + \frac{\left(V - \frac{\Omega}{e}\right)}{2}\left(1 + \text{erf}\left(\frac{2\sqrt{\ln 2}\left(V - \frac{\Omega}{e}\right)}{\gamma}\right)\right) \quad (5)$$

and $\gamma$ is the full width at half maximum of the GF. Substituting equation 2 into 1 and noting that $Y(V)=eR(V)/I_{total}(V)$, the reaction yield can be expressed as in equation 4, $$Y(V)_{tot} = \sum_i K_i \frac{f(V, \Omega_i, \gamma_i)^{n_i}}{V} \quad (3)$$

where K represents the energy transfer efficiency from the $v$ mode to the RC mode. This model has been successfully applied to inelastic electron scattering induced surface dynamical processes such as CO hopping and the configurational change of the cis-2-butene molecule on Pd(110). The indirect excitation model for $Sc_3N@C_{80}$ switching as proposed above, was tested and confirmed by fitting the action spectra in graph 1110 by equation 3. The fitting gives values for the acceptor vibrational mode energies ($\Omega$) as well as the reaction orders (n). As shown in graph 1110, the action spectra for three elementary switching processes are reproduced with a frequency $\Omega=78\pm1$ meV, consistent with $v_{as}$ being the acceptor state for all three processes; the reaction orders are n=1 for the III-III' process and n=2 for the I-I' and II-II' consistent with their substantially different yields. The reaction orders imply that the barrier of is comparable or lower than 78 meV, whereas those for I-I' and II-II' are between 78 and 156 meV. Excitation of multiple quanta of the acceptor mode by inelastic electron scattering may be necessary to induce the chemical transformation. The model can be further refined to match the gradual onset below ~70 meV for switching processes I-I' and II-II' by supposing that lower frequency modes could also contribute through the n=2 process. Indeed, including $v_s$ as an additional possible acceptor mode improves the fits in the threshold region in graph 1110. Although the quantization of the reaction coordinate can also modulate the energy dependence of the isomerization quantum yields, the RC frequencies are too small to resolve with the energy resolution of our STM.

In contrast to the three elementary switching processes, the action spectra for the II*-III* switching in graph 1120 are substantially different. In addition to having a significantly higher threshold voltage than the elementary processes, the onsets and slopes of the action spectra are different for positive and negative bias.

Comparing the action spectra, the spectroscopic dI/dV curves, and the calculated molecule localized DOS (LDOS), it was evident that the thresholds at both polarities correspond to the tunneling resonances through the frontier orbitals of the $Sc_3N@C_{80}$ molecule. Because the thresholds are significantly higher than any of the fundamental vibrational modes of $Sc_3N@C_{80}$, it was concluded that the (II*)-(III*) switching process is activated by the electronic excitations. It was surmised that switching occurs through nonadiabatic electronic relaxation depositing energy into vibrational modes of $Sc_3N@C_{80}$, possibly also involving the carbon cage (e.g., nonadiabatic charge transfer between the transiently excited cation or anion and the substrate). Note that the calculated potential surface for the $Sc_3N@C_{80}$ has an energy minimum at the transition state for the ground state hindered in-plane rotation ($\phi=0°$), as depicted in FIG. 12. This mechanism is not surprising because the II*-III* process involves a sequence of elementary rotations, which probably require a higher degree of intramolecular vibrational excitation than the elementary processes.

The experiments were performed in an Omicron LT-STM (although a different source of tunneling electrons could alternatively be used in aspects of the subject innovation). The $Sc_3N@C_{80}$ sample was prepared, purified, evaporated onto oxidized Cu(110)-(2×1)-O substrate (although a different atomically ordered substrate could be used in aspects of the subject innovation) at a submonolayer coverage. All topographic and spectroscopic data were recorded with an electrochemically etched tungsten tip (although a different STM or other electron source can employ a different tip, etc.) prepared by field emission as well as in situ cleaning treatment. The differential conductance dI/dV scans were measured by adding a 15 mV (root-mean-square (rms)) modulation at 655 Hz to the junction bias potential and demodulating the tunneling current with a lock-in amplifier.

For the theoretical analysis of $Sc_3N@C_{80}$, plane-wave basis set density functional theory (DFT) electronic structure calculations were performed using the generalized gradient approximation (GGA) with the Perdew-Burke-Ernzerhof (PBE) functional as implemented in the Vienna ab initio simulation package (VASP). The projector augmented wave (PAW) method was used to describe the electron-ion interaction. The plane-wave basis sets cut-off energy was 500 eV.

For the Sc atoms, the 1s to 2p orbitals were treated as core orbitals. For the isolated $Sc_3N@C_{80}$ molecule calculation, a cubic unit cell with dimension a=30 Å was used. The simulated switching pattern was obtained by cutting the orbital density with a spherical surface centered on the N atom and having a radius of 8 Å.

Figure 13:
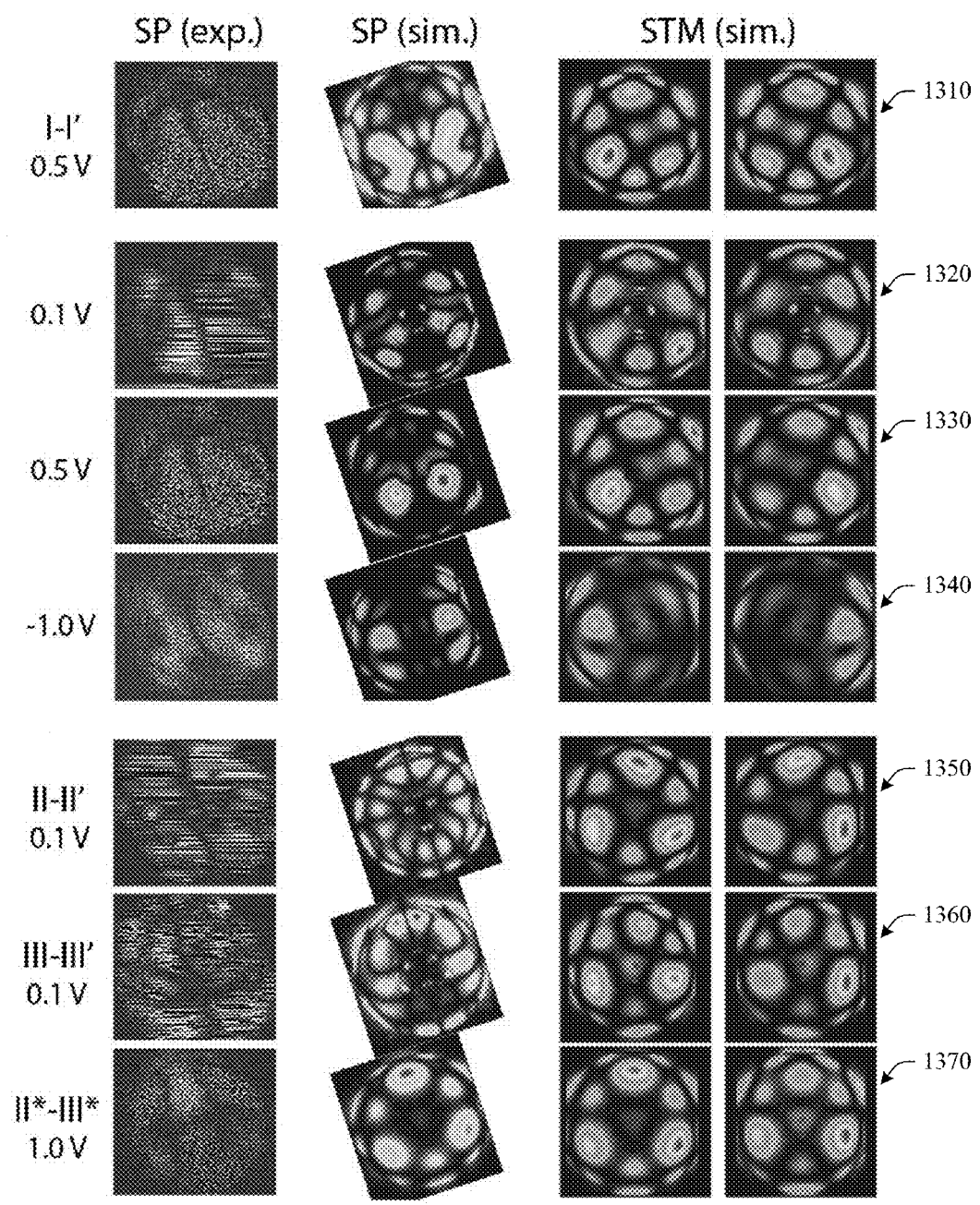
FIG. 13 illustrates the most consistent simulated switching patterns and the associated simulated STM images

The experimental switching patterns were assigned to different internal cluster rotational motions based in part on the theoretical simulation of STM images. The starting point for the assignments were electronic structure calculations for a free $Sc_3N@C_{80}$ molecule. It was reasoned that adsorption does not change the electronic structure of the $Sc_3N@C_{80}$ significantly, because the calculated DOS (the black curve in graph 510) reproduces the main features of the experimental dI/dV spectrum (graph 1120) on the $Sc_3N@C_{80}$. Therefore, the STM images were first simulated considering solely the contribution of the lowest unoccupied molecular orbital (LUMO) of free $Sc_3N@C_{80}$ molecule. The SPs were produced by taking the absolute value of the difference between two related STM images of putative isomers, and then comparing them with the experimental $SP_I$ recorded at 500 mV. Guided by the symmetry restrictions discussed above, all the possible cage and cluster orientations were considered. FIG. 13 shows the most consistent simulated SPs and the associated simulated STM images in rows 1310-1370. In FIG. 13, the first column contains experimental switching pattern STM images, the second contains simulated switching patterns, and the third and fourth contain simulated STM images. Rows 1310 through 1340 show $SP_I$ at various bias voltages, and 1350-1370 show the switching patterns for II↔II', III↔III', and II*↔III*. The model that gives the best correspondence with the $SP_I$, has the cage with a $C_{666}$ atom facing down and the $Sc_3N$ cluster nearly vertical.

The simulation was then refined by calculating the electronic structure for the same molecular geometry on the Cu(110)-(2×1)-O substrate. From FIG. 6, it can be seen that $Sc_3N@C_{80}$ has a reflection plane perpendicular to the surface oriented in the <001> direction, passing through a Cu—O chain. Therefore, to perform DFT calculations to optimize the molecular and electronic structure of the adsorbed $Sc_3N@C_{80}$ molecule, the $Sc_3N@C_{80}$ was put onto the surface above the Cu—O chain with the appropriate orientation. The simulated SPs at different energies (rows 1310 through 1340) agree well with the experimental results, supporting this assignment of the $SP_I$.

Figure 14:
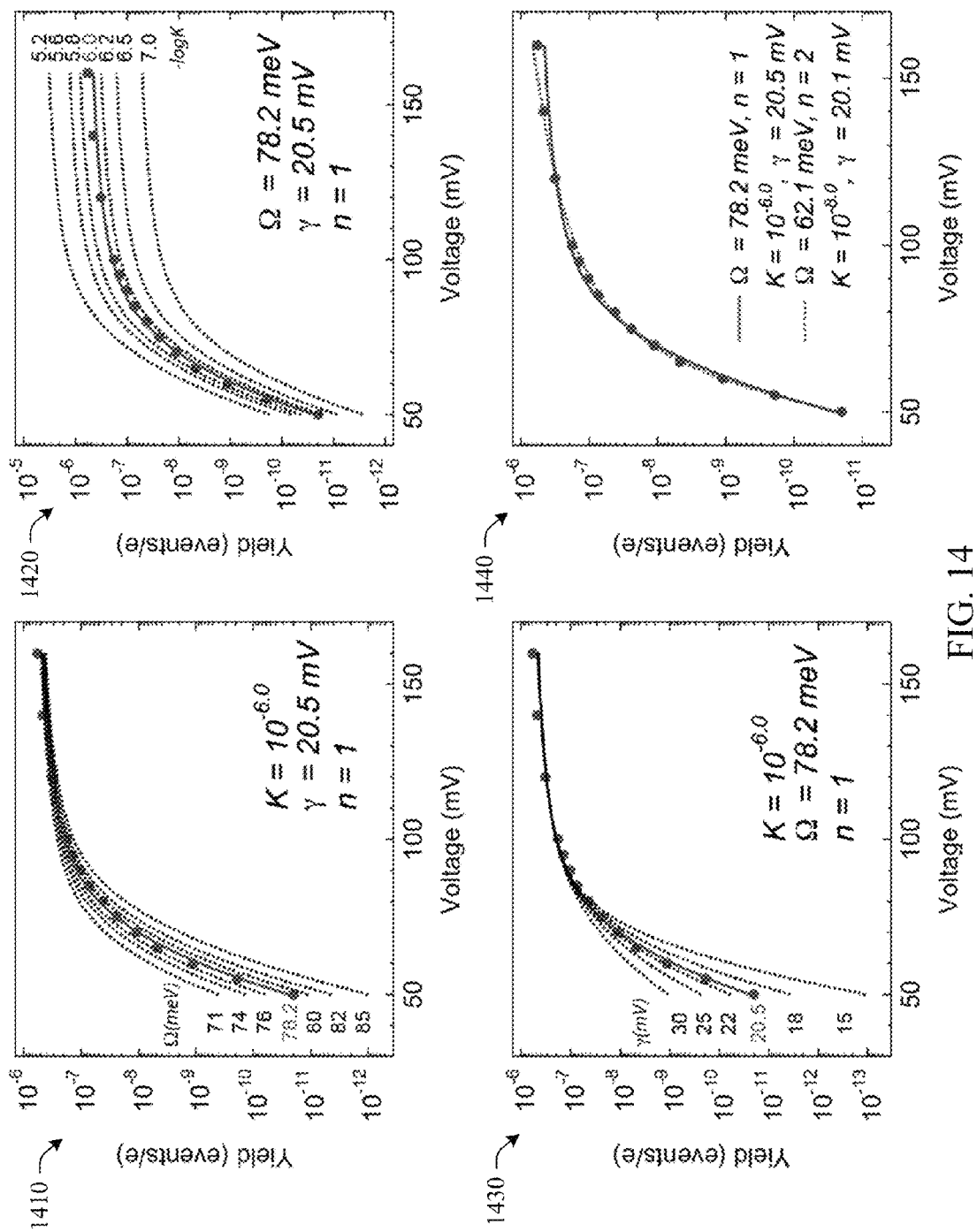
FIG. 14 illustrates the dependence of fitted action spectra on the acceptor state frequency $\Omega$, acceptor state energy width $\gamma$, acceptor state excitation efficiency K, and reaction orders n.

The adsorption model was then used as described above, and similar calculations were performed for other cluster orientations for the fixed the cage orientation. From the calculated structures and SPs, the best correspondence with the experimental SPs was sought for the switching processes II-II', III-III' and II*-III*. The most consistent simulated SPs that were the basis for assignments discussed herein are shown in rows 1310 through 1340. FIG. 14 illustrates the dependence of the fitted spectra on $\Omega$, K, $\gamma$, and different reaction orders n, in 1410, 1420, 1430, and 1440, respectively.

Theoretical and experimental results discussed herein demonstrate a surface-supported multi-level hierarchical conductance switch based on single endohedral fullerene molecule enantiomerization. By ensconcing the switching unit within the protective carbon cage, the switch gains multiple advantages, including: (i) the switching preserves the external molecular shape, simplifying the connection to the external electrodes; (ii) the carbon shell also acts as a molecular shield preserving the functional element from external perturbations as well as hindering the dissipation of energy from the RC modes; (iii) the spherical shape and small volume of the active element are ideal for high density integration; and (iv) the internal cluster and carbon shell can be selected independently to optimize the device performance. For example, substituting Sc for a larger metal ion can increase the barrier to the hindered rotation. Therefore, the subject innovation is general and can be extended to a range of molecules by independent design of fullerene cage, internal cluster, and external molecular leads to control the symmetry, the charge and spin state, and the barriers to internal motions among multiple potential minima actuated by electrical, spin, and optical stimulation. For example, the charge, spin, and the phonon degrees-of-freedom of a molecular switch in accordance with the subject innovation can be controlled by applied redox potential.

As noted, the experimental results discussed above focused on a subset of molecules with reproducible distinct multi-level switching behavior. However, other molecules were studied; several other molecules had asymmetric and difficult to characterize SPs, and a minority of molecules did not even switch. The heterogeneous behavior of $Sc_3N@C_{80}$ was attributed to chemisorption with different rotational and azimuthal orientations that can lead to differences in symmetry, barriers to cluster rotation, modes of coupling of tunneling electrons to the cluster motion, as well as vibrational and electronic state lifetimes. In applications where switching must be uniform, thermal and kinetic deposition and assembly conditions must be optimized to obtain uniform properties in terms of structure and function. Using templates formed on the substrate during the deposition is also a practical way to control the adsorption to achieve the uniformity.

The subset of molecules for which experimental results are provided herein interconvert among six out of forty possible ground states. In the absence of the substrate, all 40 possible configurations would be equivalent, therefore the substrate plays a decisive role in determining how many ground states are accessible and making the ground states distinguishable. The substrate could also influence the barriers to interconversion, though this did not appear to be the case for the Cu(110)-O surface. The choice of substrate can be used to tune the switching behavior by affecting the dynamical molecule-metal coupling, through the symmetry of the substrate, and by chemisorption-induced charge transfer.

The atom-like building-block structure and multi-level switching capability make endohedral fullerene-based devices ideal for molecular scale integration into more complicated structures such as parallel computing architectures, by connecting leads to actuate and couple multiple devices. Although in the experiments presented herein strong evidence for coupling between two molecules interacting through dispersion forces was not observed, stronger coupling between covalently connected molecular assembles is anticipated. These assembles can either be prepared by chemical synthesis, or through surface polymerization processes by the excitation of electrons or photons.

Finally, multistate switching may enable engineering of multiple logic functions within a single molecule. Molecular systems are thus not limited to binary logic and could therefore gain additional advantage over the conventional semiconductor electronics. Indeed, multistate molecular switches have been demonstrated before, and their advantages recognized, but they have never been demonstrated at single molecule level in an elegantly simple form as presented in embodiments of the subject innovation, such as in $Sc_3N@C_{80}$.

In an additional study, the inelastic electron driven nuclear dynamics of one of the simplest known endohedral fullerenes, $Li@C_{60}$ were explored. This study built on the previous theoretical studies of current-driven dynamics in fullerene junctions by including both the center-of-mass and internal coordinate dynamics. The results presented herein take advantage of the lowest lying superatom molecular orbital (SAMO), the atom-like s-symmetry molecular orbital, in the current-induced dynamics of a Li@$C_{60}$ molecule. Experimentally, this endohedrally doped fullerene has shown promise for enhanced conductance relative to $C_{60}$ as well as amplified optical properties. Other studies have considered the electronic structure of Li inside fullerenes using Hartree-Fock and various density functional theory (DFT) methods. The results of these studies point to a significant charge transfer in the ground state of an isolated molecule between the Li and the fullerene cage, corresponding to at least +0.6e, dependent on the position of the atom inside the carbon shell. As a result of the Coulomb interaction between the Li atom and the carbon cage, the atom is displaced from the center of $C_{60}$ by approximately 1.5 Å. Doping $C_{60}$ with metal atoms has also been shown to influence its SAMOs by reducing the LUMO-SAMO energy gap through hybridization between s-symmetry states of the atom and the hollow cage. In the case of Li, this interaction reduces the LUMO-SAMO gap from 3.28 to 1.10 eV when the Li atom is at the center and to 2.05 eV when Li is in its ground state equilibrium position. This sensitivity of the s-SAMO to the position of the Li atom introduces coupling of the electron and nuclear motions, making Li@$C_{60}$ an intriguing system for understanding the actuation of internal atom/cluster motions in endohedral fullerene based molecular machines.

Regarding the dynamics of Li inside the fullerene, investigations have been carried out both experimentally, using IR and Raman spectroscopies, as well as theoretically by simulating rotational/vibrational spectra of isolated molecules. The modeling efforts have largely relied on solving a three-dimensional Schroedinger equation for the Li atom subject to an interaction potential with a stationary carbon cage. While Li is often assumed in these studies to be held in a spherically symmetric potential well, recent work has suggested that this is an idealization and, in reality, the Li atom experiences the corrugation of the carbon shell with small barriers existing between the various hexagonal and pentagonal sites that localize the low-lying Li nuclear wave functions.

The results discussed herein tie together the transport and dynamical properties of endohedrally doped fullerenes discussed above which, in addition, carries interesting potential applications. Specifically, theoretical modeling was performed on a molecular electronic junction, where a Li adatom embedded in a fullerene cage was, in turn, contacted to two metallic electrodes and driven by a current excited between them. These results allowed for modeling of the internal femtochemistry induced by the charge transmission through the Au—Li@$C_{60}$—Au junction and application of the results to understand the potential impact of doped fullerenes on the fields of molecular electronics and nanoelectromechanical systems (NEMS). The following results describe the potential energy surface for the relevant nuclear degrees of freedom for current-induced motion in a Au—Li@$C_{60}$—Au junction, focusing on the dynamical properties conferred by the s-SAMO resonance and discuss the interplay between the Li and fullerene dynamics.

Figure 15:
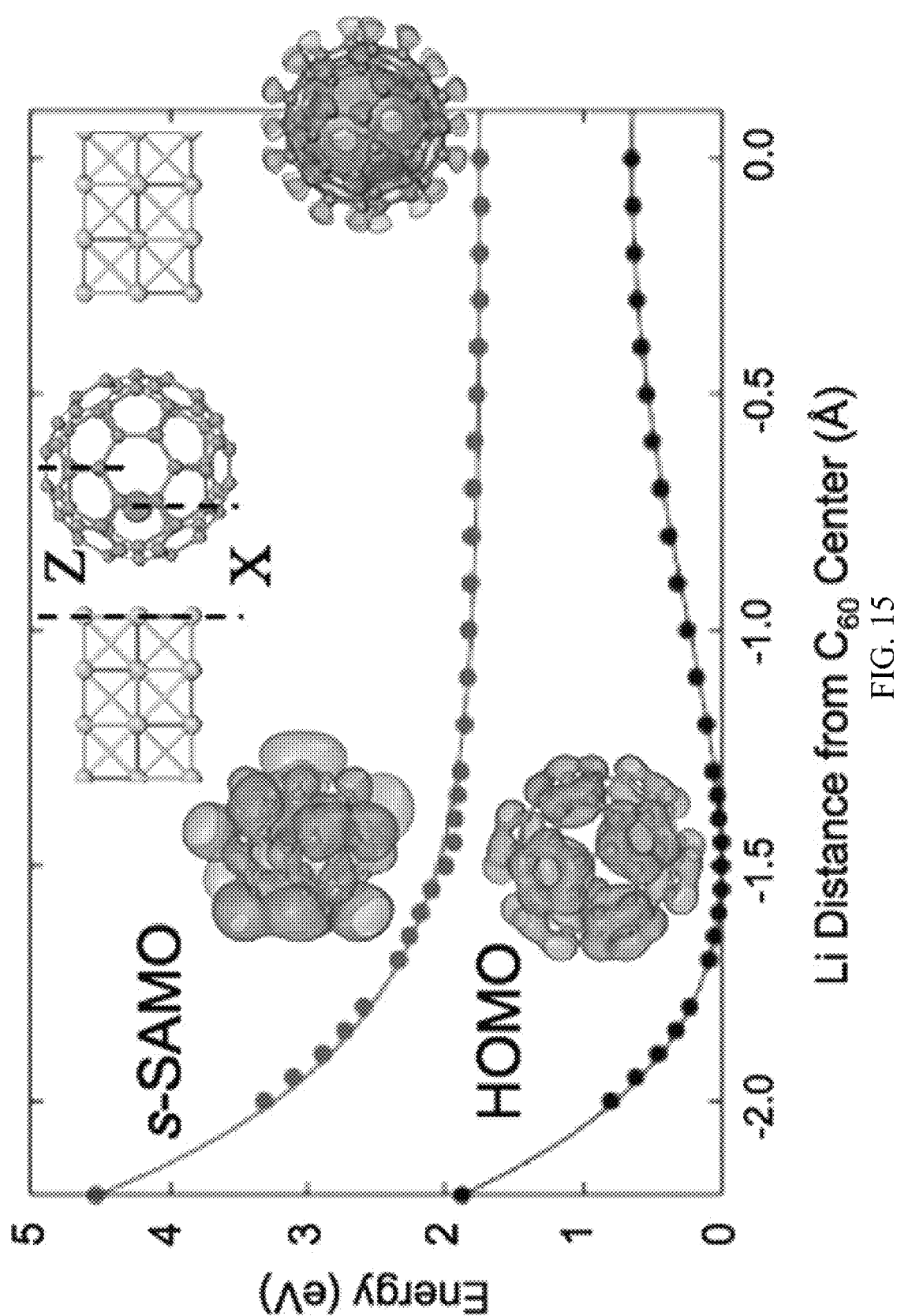
FIG. 15 illustrates the highest occupied molecular orbital and the superatom molecular orbital for $Li@C_{60}$.

The dynamics of the Li atom within the $C_{60}$ cage were based on potential energy curves calculated by density functional theory (DFT). FIG. 15 illustrates the resulting HOMO (highest occupied molecular orbital) and s-SAMO are shown on the left-hand side of FIG. 1 with the Li atom at its equilibrium position, centered on a hexagonal face of the fullerene. Comparison of the HOMO of Li@$C_{60}$ in FIG. 15 with that of a bare $C_{60}$ molecule (not shown) indicates that the asymmetric position of the Li atom within the fullerene cage hardly perturbs the HOMO distribution, because the constituent C 2p orbitals are strongly bound to C atom cores. This is in fact true for all of the σ and π orbitals of fullerenes. In contrast, as noted in previous work, the asymmetric location of the Li atom perturbs the spherical symmetry of the SAMO, but the high degree of delocalization of the orbital is still retained. The sensitivity of the SAMO to the position of the Li atom derives from hybridization with the 2s orbital of Li, and is evident in FIG. 15, which compares the s-SAMO with the Li placed at its equilibrium positions in the ground (left-hand side) and the excited state (right-hand side). One can expect strong coupling to be induced between the electron and Li atom motions by transient electron scattering through the s-SAMO resonance, which projects a ground state wave packet onto the s-SAMO surface far from its equilibrium position. The inset of FIG. 15 includes a model of the Au—Li@$C_{60}$—Au junction of this study.

Prior work has investigated the ground state $M^+$@$C_{60}^-$, where M stands for an alkali atom, and the excited charge-transfer state of M@$C_{60}$ using local basis sets and the ASCF method. The excited potential energy curve in that prior work likewise had a minimum at the center of the cage. One can see from the potential energy curves for the system in FIG. 15 that the equilibrium position of the Li atom in the ground state is about 1.5 Å displaced from the center of the $C_{60}$ and the depth of the well, created predominantly by the Coulomb interaction with the carbon cage, is about 0.65 eV. The results for the equilibrium position, well depth, and vibrational frequency, 353 cm$^{-1}$, from this study were in good agreement with previous calculations.

Figure 16:
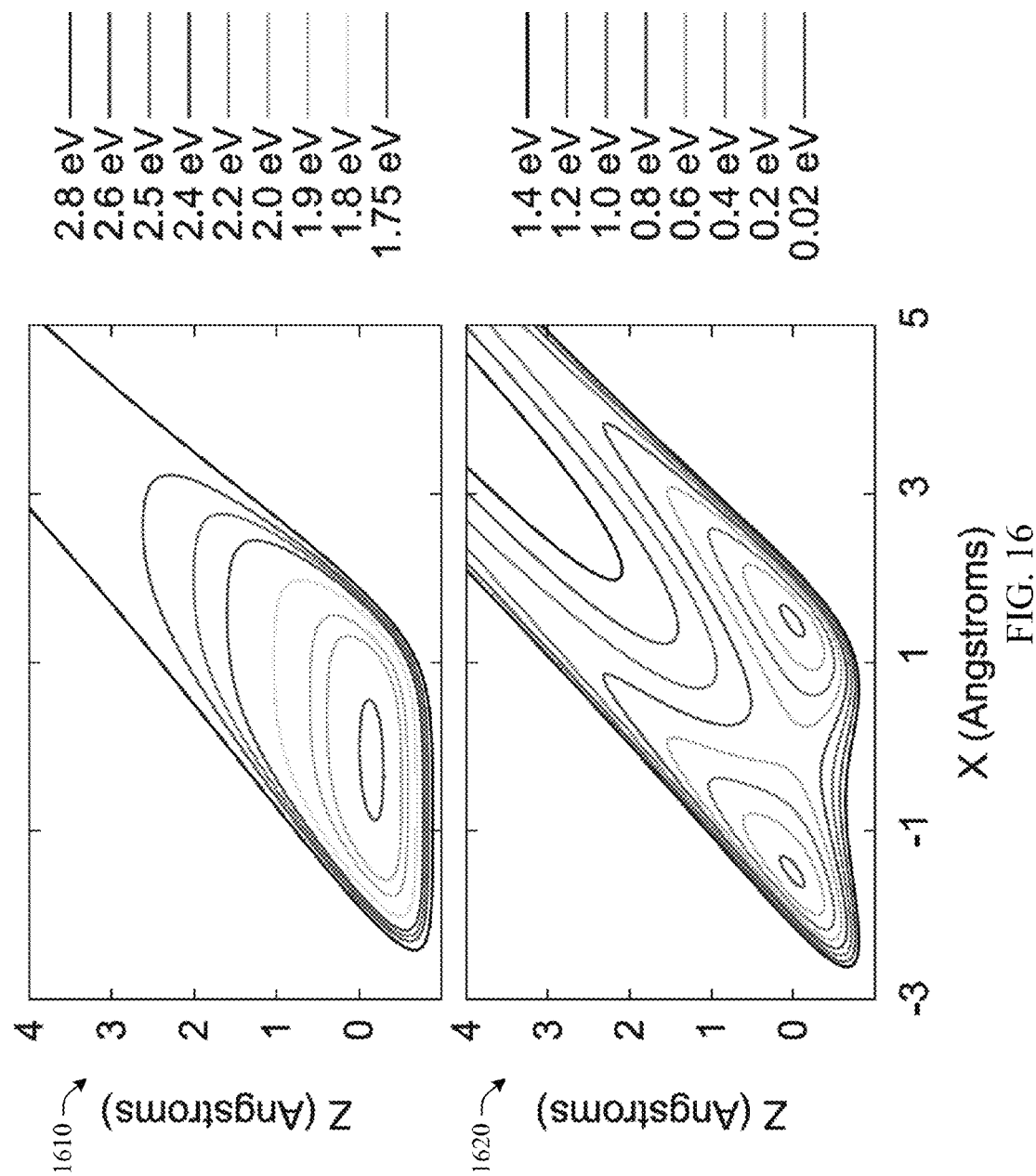
FIG. 16 illustrates two-dimensional potential energy surfaces for the initial and resonance states of $Li@C_{60}$ in a gold junction.

A molecular junction was considered with general construction is shown in the inset of FIG. 15. The metallic electrodes break the spherical symmetry of the Li nuclear wave function and restrict the motion of the atom to one dimension, namely, the coordinate along which current drives the system (the X-coordinate in FIG. 15). Following previous work, the dispersion interaction between the fullerene and the gold electrodes was accounted for by using a Morse potential for the center-of-mass coordinate, Z. Studies of the charged states of Li@$C_{60}$ indicate that the charge distribution is not greatly affected by the adatom, allowing the study to make use of a shifted potential model. Within this model, the additional charge was assumed to be distributed across the carbon shell and to interact with its image in the metal electrode. The image charge interaction shifts the equilibrium of the $C_{60}$ center-of-mass closer to the electrode surface, resulting in a charged state potential curve, which is shifted in equilibrium with respect to the ground state but is not altered in shape. At relevant interelectrode distances, the $C_{60}$ is in chemical contact with only one of the two electrodes and the second electrode does not directly modify the nuclear dynamics. It affects the electronic dynamics, however, via its influence on the resonance lifetime. The functional form of the two-dimensional potential surface in terms of the coordinates of FIG. 15 is given by equation 6, $$V_N = D_{C_{60}}(e^{-2\alpha_{C_{60}}Z} - 2e^{-\alpha_{C_{60}}Z}) + D_{Li}(e^{2\alpha_{Li}(X-Z-X_{eq})} - 2e^{\alpha_{Li}(X-Z-X_{eq})}) + D_{Li}(e^{-2\alpha_{Li}(X-Z+X_{eq})} - 2e^{-\alpha_{Li}(X-Z+X_{eq})}) + V_N^0 \qquad (6)$$

and equation 7, $$V_E = \tag{7}$$
$$D_{C_{60}}\left(e^{-2\alpha C_{60}(Z+\Delta_{eq})} - 2e^{-\alpha C_{60}(Z+\Delta_{eq})}\right) + F_0(e^{\beta(X-Z)} + e^{-\beta(X-Z)}) + V_E^0$$

where $V_N$ is the initial state potential and $V_E$ corresponds to the resonance state. The various parameters are defined in Table 1, below. FIG. 16 illustrates the resulting two-dimensional potential energy surfaces for the resonance state at 1610 and the initial state at 1620. It should be noted that the actual well depth and the equilibrium distance differ from the standard interpretation of the Morse potential parameters as a result of the overlapping ranges between the two functions that constitute the 2D (center-of-mass and Li atom motion) surfaces.

TABLE 1

Potential Energy Fitting Parameters for equations 3 and 4

| Parameter | Value (Distances in Å; Energies in eV) |
|---|---|
| $D_{C60}$ | 1.0000 |
| $\alpha_{C60}$ | 0.9677 |
| $V_N^0$ | 2.9900 |
| $D_{Li}$ | 1.8379 |
| $\alpha_{Li}$ | 1.0374 |
| $X_{eq}$ | 1.5349 |
| $\Delta_{eq}$ | 0.1600 |
| $V_E^0$ | 2.7250 |
| $F_0$ | $2.8106 \times 10^{-2}$ |
| $\beta$ | 3.1356 |

Figure 17:
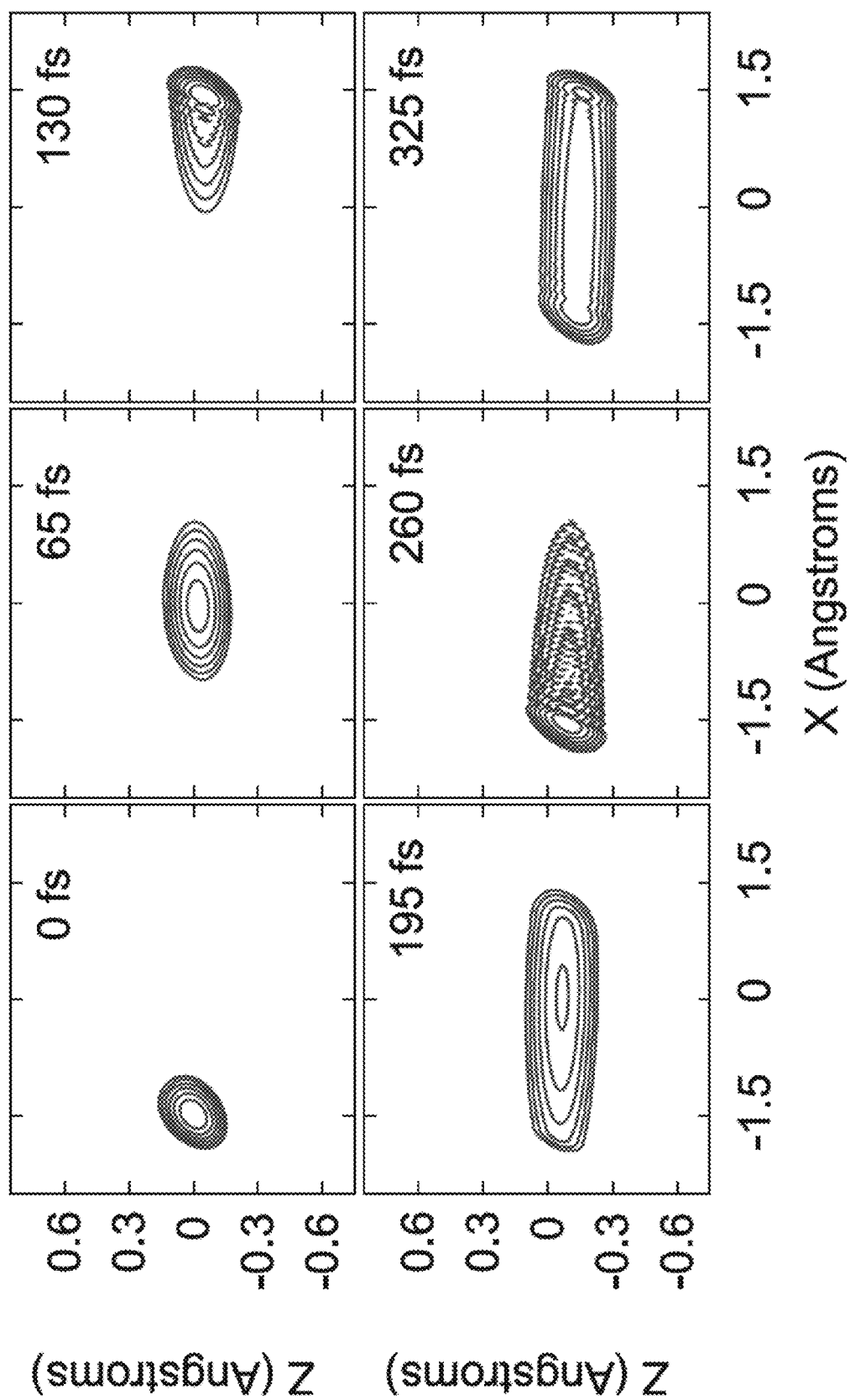
FIG. 17 illustrates the probability density at various times following excitation of the resonance state of $Li@C_{60}$ in the junction.
Figure 18:
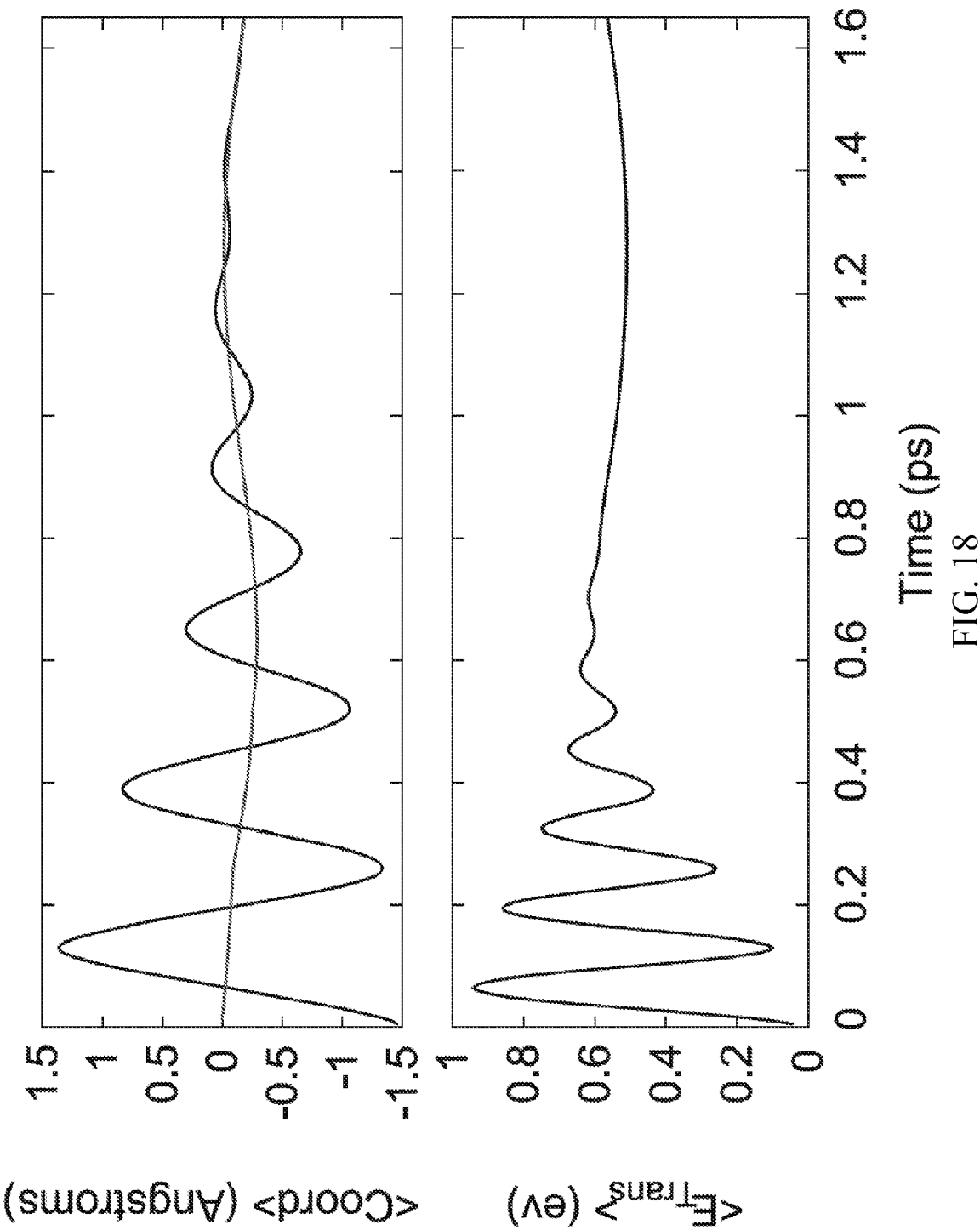
FIG. 18 illustrates expectation values of coordinates and translational energy of $Li@C_{60}$ in the junction.

FIG. 17 illustrates the nuclear dynamics resulting from the instantaneous promotion of the nuclear wave function onto the excited anion state during the electron scattering event. As is clear from the first 325 fs of the evolution, the Li atom initially finds itself on a repulsive wall of the resonance surface, which kicks it toward the center of the fullerene cage. After 130 fs, the wave packet encounters the far wall of the fullerene and is reflected back toward its starting position. Subsequent dynamics involve the continued oscillation of the Li atom between the two walls of the fullerene cage, as shown in FIG. 18, which is accompanied by wave packet dephasing as a result of the anharmonicity of the resonance potential, with (X) as the rapidly oscillating curve, and the other representing (Z). The dephasing expresses itself, as seen in FIG. 17, by the spreading of the wave packet in the X-coordinate and the gradual decay of the oscillation amplitude of (X) (see FIG. 18). Motion in the Z-coordinate in the resonance state is much smaller in amplitude, because the extent of the dynamics is determined by the shift in equilibrium position, $\Delta_{eq}$, between the two potential energy surfaces. Given that $\Delta_{eq}$ is on the order of tens of picometers, the resulting oscillation amplitude is an order of magnitude smaller than that of the lithium dynamics, as evidenced by FIG. 18. The period of motion in the center-of-mass coordinate is nearly 2 orders of magnitude larger than that for the induced lithium oscillations, which implies that the center-of-mass motion will not be heavily influenced by the details of the rapid lithium dynamics. Rather, the fullerene will experience only an effective interaction averaged over multiple lithium vibrational periods and, given the symmetry of the potential about X=0, one might expect this averaged interaction to be small. From a purely classical standpoint, one would intuitively expect that, due to the large mass disparity between the fullerene and the Li, the impulse imparted by the Li motion will not greatly affect the fullerene motion. Calculation of the energy transferred to the nuclei as a function of the residence time substantiates the above qualitative anticipation, as seen in FIG. 18. Maxima in the energy transferred occur at half the period of the <X> oscillations. These maxima in energy correspond to residence times in the resonance state where the atom has acquired substantial kinetic energy and is projected onto high energy portions of the ground state potential, both conditions being fulfilled at X=0.

Figure 19:
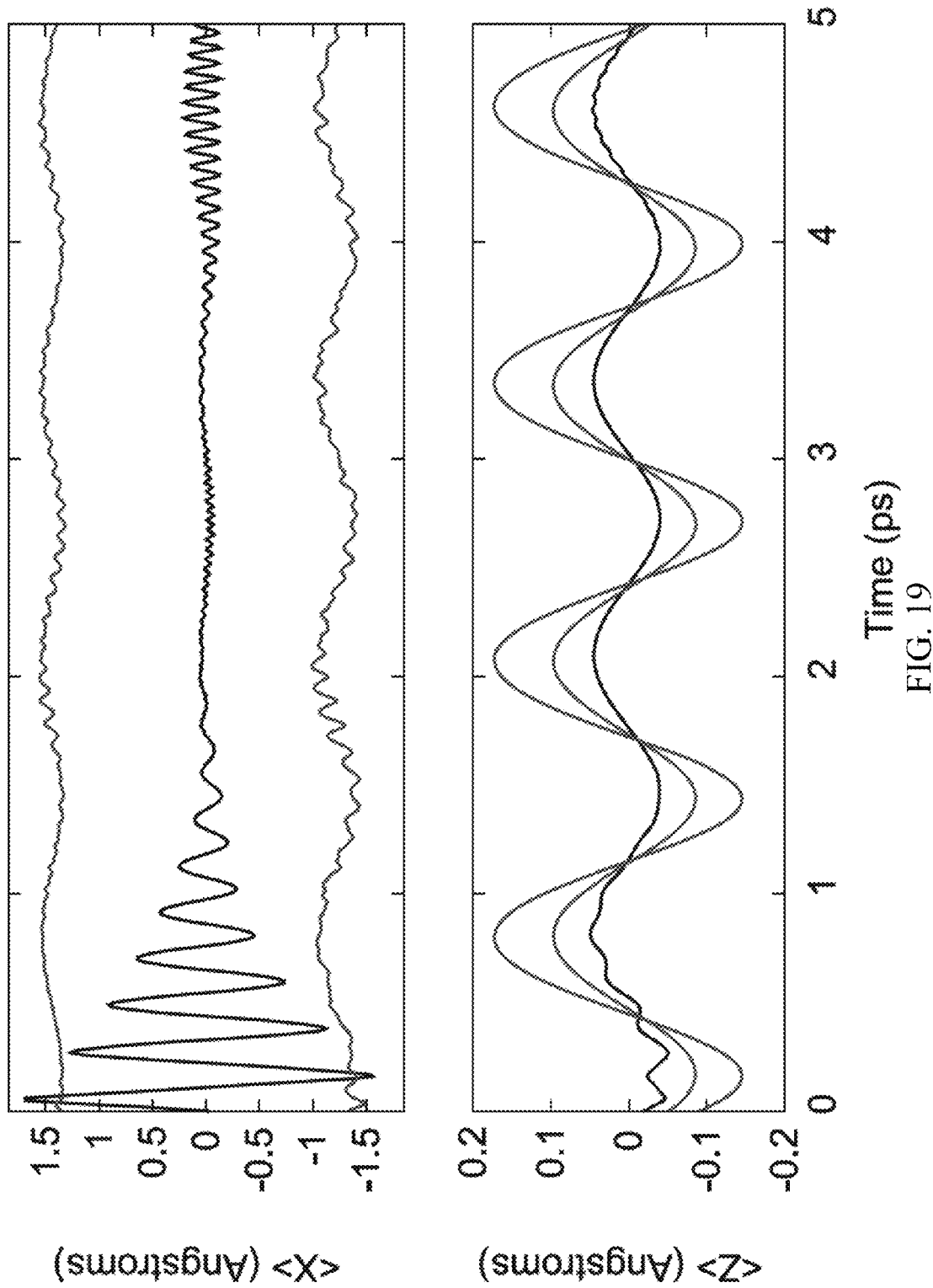
FIG. 19 illustrates expectation values of the X and Z coordinates upon relaxation of $Li@C_{60}$ to the neutral state.

Upon relaxation to the neutral state, the induced dynamics follow the oscillations of the Li atom and the fullerene on the resonance surface. For residence times when the Li atom is at X-values corresponding to the barrier region of the ground state, that is, maxima in the energy transferred (see FIG. 18), a large portion of the wave packet is projected onto eigenstates above the barrier and the largest amplitude neutral state motions are observed. This is evident in FIG. 19, illustrating expectation values of the X and Z coordinates upon relaxation to the neutral state, where the X-motion following the relaxation to the neutral state after a residence time of $\tau_R$=65 fs (the central curve in the top graph and the lowest amplitude curve in the lower graph) shows the Li atom shuttling between the two minima of the potential. As the Li atom approaches X regions in the resonance state that correspond to the well regions of the ground state, the dynamics upon relaxation to the neutral state become more confined and the Li atom is again trapped in a local minimum. Hence, for residence times of 130 fs (the top curve in the top graph, and the middle amplitude curve in the lower graph) and 260 fs (the bottom curve in the top graph and the highest amplitude curve in the bottom graph), the atom remains localized within one of the double-well minima in the ground state. It is of interest to note that even in these circumstances, the system experiences some additional oscillation in the lithium coordinate, however, at the frequency of the center-of-mass motion rather than at that of the purely lithium vibration. These oscillations correspond to nonadiabatic coupling between the fullerene and Li vibrations, that is, the fullerene moving sufficiently fast to perturb the eigenstates in the X-coordinate. The effect of the lithium motion on the $C_{60}$ coordinate are negligible for $\tau_R$ corresponding to trapping the atom in the minima of the ground state, which is in accord with anticipations described above. Surprisingly, however, signatures of the lithium oscillation at instances when the energy transferred to the X-coordinate is at a maximum can be recognized. Thus, the lithium motion is able to induce excitation of the fullerene dynamics, despite the large mismatch in masses.

Figure 20:
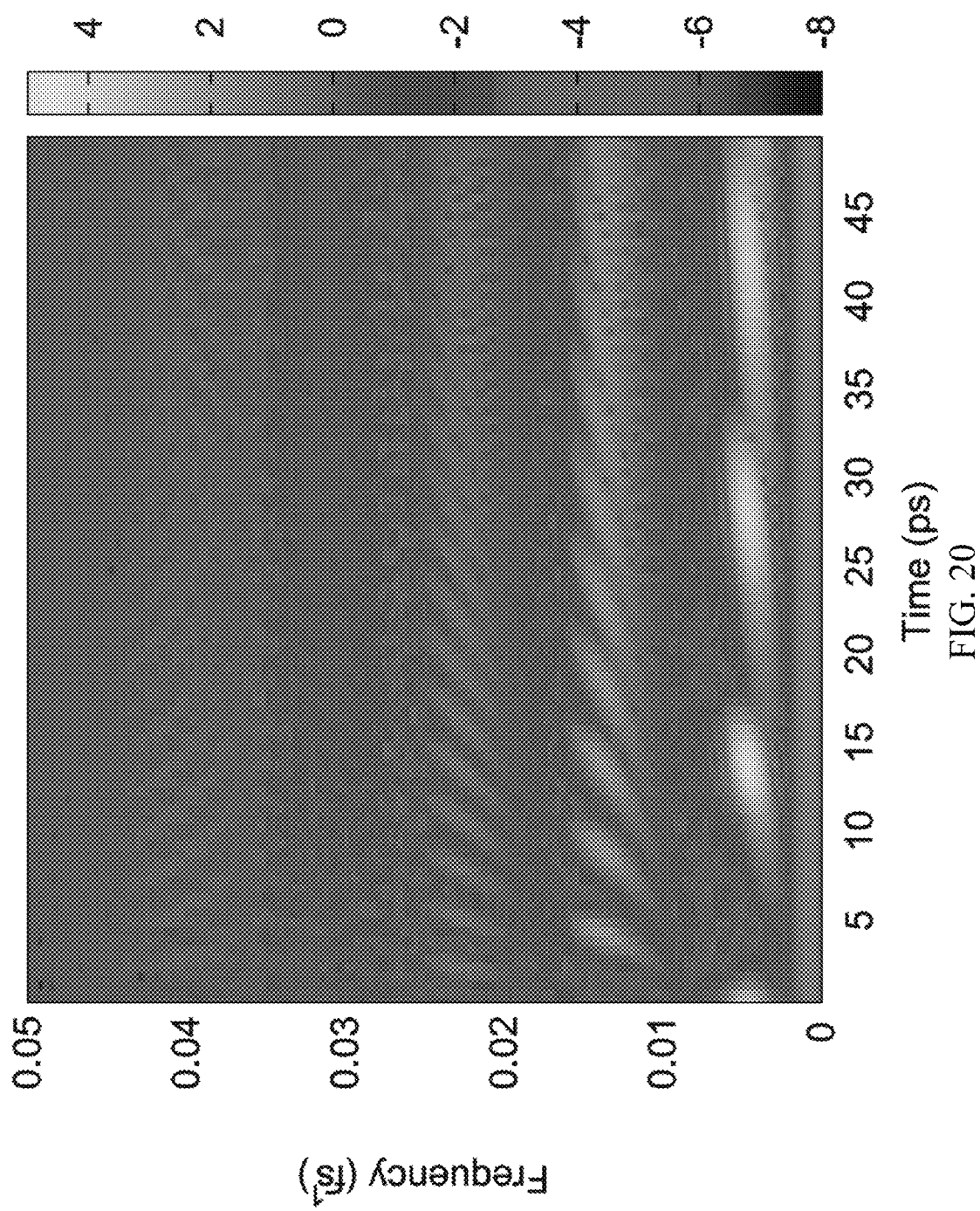
FIG. 20 illustrates a plot of the logarithm of the time-windowed power spectrum of the expectation value of the X coordinate of $Li@C_{60}$ in the junction.

The behavior of <X(t)>, as shown in FIG. 19, demonstrates the presence of multiple time scales in the wave packet dynamics. In particular, for a residence time of 65 fs, one sees the initial oscillation of the Li as it shuttles between the wells of the potential, followed by a second very low amplitude oscillation from 2 to 4 ps, which corresponds to the center-of-mass motion and, finally, a much higher frequency component that appears after 4 ps. While the former two frequencies have obvious physical origins, the puzzling presence of the high frequency component lead to investigation of the time-windowed Fast Fourier Transforms of the (X(t)) signal. The window selected for the analysis was the $\cos^2(\pi(t-t_0)/T)$ function, also known as the Hanning window, where the time origin ($t_0$) was varied to sample the signal and the width of the time-window (T) was taken as 300 fs. FIG. 20 illustrates a plot of the logarithm of the resulting power spectrum. One can clearly see a continuous band located along the bottom of the graph near zero frequency, corresponding to the fullerene oscillation. The next highest band, located around 0.005 fs$^{-1}$, corresponds to the frequency of the initial Li bouncing motion, which undergoes continual dephasing and rephasing in the power spectrum in accordance with the revival time for the Li shuttling motion. One also observes regularly spaced structures at higher frequency, which grow and disappear in time in a similar fashion, but on shorter time scales. These structures correspond to fractional revivals of the system and explain the origin of the signature seen in <X(t)> for a 65 fs residence time (see FIG. 19).

Figure 21:
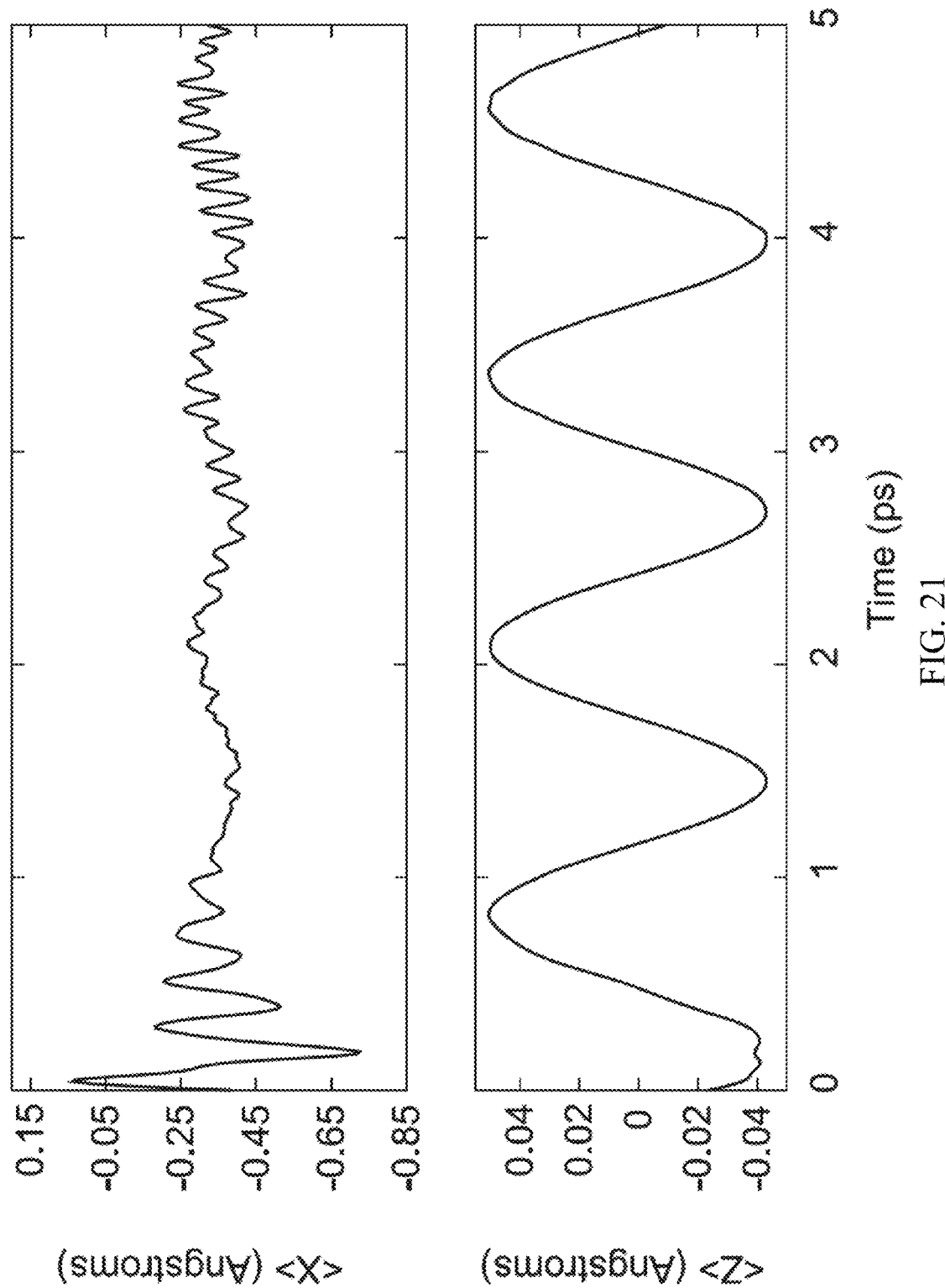
FIG. 21 illustrates the $\tau_R$-averaged expectation values of X and Z upon relaxation to the neutral state.

FIG. 21 illustrates the $\sigma_R$-averaged expectation values upon relaxation to the neutral state; these expectation values capture the above-mentioned quantum dynamics for both coordinates. In the X-degree of freedom, one can see the lithium motion induced by the nonadiabatic electron transfer producing a shuttling motion between the ground state minima for the first picosecond. This is followed by oscillations in the lithium coordinate resulting from nonadiabatic coupling to the $C_{60}$ motion. The $\tau_R$-averaged center-of-mass dynamics, <Z>, is impacted to only a mirror extent by the nonadiabatic coupling to the Li atom vibration over the relevant time scales.

To obtain the results discussed above for Li@$C_{60}$, single point energy calculations were carried out within density functional theory and fitted to functional forms to generate potential curves for the Li motion in the s-SAMO derived and the ground (HOMO) states. The generalized gradient approximation was coupled with the PBE functional in the Vienna ab initio simulation package (VASP) using a plane wave basis set. The cubic unit cell with dimension of 3.0 nm contained a single $C_{60}$ molecule. The projector augmented wave (PAW) method was used to describe the electron-ion interaction and the plane wave basis set cut off energy was set to 400 eV. The potential energy curves for the Li atom motion inside the fullerene cage were calculated by varying its position along the line passing from the $C_{60}$ molecule center through the center of a hexagonal face in both the ground and the s-SAMO derived anion state Li@$C_{60}^-$. A Koopman-type approximation was made to calculate the excited electronic potential energy curve for the anion when the s-SAMO is occupied. By adding the Kohn-Sham energy of the SAMO to the ground state values, an approximation to the potential curve for the excited resonance surface was obtained.

The shape of the ground state was well approximated by a Morse potential and this observation was used in the model to simplify the interaction potential. A Morse function for modeling the nuclear dynamics was obtained by a nonlinear least-squares fit of the ab initio data. The approximate excited state was not as smooth as the ground state curve, but could be fit accurately to an exponential function. The ab initio data and the nonlinear fits are shown in FIG. 15 (Only half of the Li coordinate range is shown in FIG. 15 because the potential curves are symmetric with respect to the center of the $C_{60}$.).

As mentioned above, an accurate description of the resonance scattering dynamics requires a proper account of the nonequilibrium physics, the open boundary in the electronic subspace, and the coupling of the nuclear dynamics to phonons and electron-hole pair excitations in the two electrodes. These events, along with the strongly nonadiabatic vibronic dynamics, are captured within the density matrix scattering formalism. In the results presented herein, a much more qualitative model was invoked. Within this approach, the electron scattering event was described in the nuclear subspace by a series of instantaneous transitions between the ground and excited electronic states. The initial wave function was projected onto the resonance state, corresponding to a charge attachment to the fullerene, and the nuclei were allowed to evolve for a residence time $\tau_R$ before being instantaneously projected back to the neutral ground state, corresponding with electronic relaxation. To account for the continuous nature of the relaxation, this procedure was repeated for a range of resonance state residence times, and the observables were averaged over $\tau_R$ with an exponential weight function, $e^{-\tau_R/\tau}$, where $\tau$ is the resonance lifetime.

For the Au—$C_{60}$—Au system, previous calculations have found a resonance lifetime of 71.5 fs, and this value was used also in the simulations of the Au—Li@$C_{60}$—Au system as described herein. The initial wave function for the system was taken to be the ground vibrational state and was calculated on a coordinate grid subject to the potential of equations 6 and 7. The momentum operator incorporated in diagonalization of the Hamiltonian of the system was written within the Discrete Variable Representation (DVR), and the nuclear dynamics were propagated using the split-operator technique. The spatial and temporal parameters used in these calculations are collected in Table 2, below, which indicates the coordinate range used, the number of points per degree of freedom, the time step dt, and the residence time step $d\tau_R$.

TABLE 2

Parameters for Calculating the Ground State Wavefunction and Nuclear Dynamics for Current-Driven Dynamics in the Au—Li@$C_{60}$—Au Junction

| Parameter | Value (Distances in Å; Energies in eV) |
|---|---|
| $Z_{max}$ | 1.0000 |
| $Z_{min}$ | 0.9677 |
| $X_{max}$ | 2.9900 |
| $X_{min}$ | 1.8379 |
| nX | 1.0374 |
| nZ | 1.5349 |
| dt | 0.1600 |
| $d\tau_R$ | 2.7250 |

The results of this second study focused on the current-driven dynamics of substituted-fullerene-based junctions, and specifically addressed the case of Au—Li@$C_{60}$—Au conductance junctions subject to resonant current. This system exhibits coupled two-dimensional dynamics, wherein the $C_{60}$ cage bounces against the gold electrode, slightly perturbed by the embedded atom, while the Li atom exhibits higher frequency, large amplitude oscillations with respect to the fullerene wall, which are strongly coupled to the $C_{60}$ center-of-mass translation. Essential to these motions is an inelastic, resonant tunneling event involving a partially charged state of the Li@$C_{60}$ system.

In various aspects, substituted-fullerene-based junctions can be employed in connection with systems and methods of the subject innovation. Such junctions can offer large amplitude yet stable motion, of potential application for nanoelectromechanical systems, along with widely tunable properties, adjusted by choice of the dopant and the fullerene size and the dopant ionization potential. Some embodiments can employ the simplest case of atom shuttling (translation) within a fullerene cage, but other embodiments can employ more complex motions, such as endohedral cluster rotations and vibrations (e.g., as described above in connection with $Sc_3N$@$C_{80}$ and similar endohedral fullerenes with trapped clusters), to provide additional dynamical degrees-of-freedom for modulating electron tunneling within metal-endohedral fullerene-metal junctions. Moreover, the encapsulation of magnetic atoms or clusters in a fullerene cage would offer spin dynamics to be coupled with the internal and center-of-mass motions.

What has been described above includes examples of the innovation. It is, of course, not possible to describe every conceivable combination of components or methodologies for purposes of describing the subject innovation, but one of ordinary skill in the art may recognize that many further combinations and permutations of the innovation are possible. Accordingly, the innovation is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A system, comprising:
a first contact, wherein the first contact is atomically ordered;
an endohedral fullerene comprising a fullerene cage and a trapped cluster or a trapped atom, wherein the endohedral fullerene is in chemical contact with the first contact; and
a second contact in proximity to the endohedral fullerene, wherein a tunneling current is applied to the endohedral fullerene, wherein the tunneling current excites one or more motions of the trapped cluster or the trapped atom, and wherein the conductance of the endohedral fullerene is changed based at least in part on the one or more motions.

2. The system of claim 1, wherein the fullerene cage is a $C_{80}$ molecule.

3. The system of claim 2, wherein the trapped cluster or the trapped atom is a trapped metal nitride cluster.

4. The system of claim 3, wherein the trapped metal nitride cluster has the formula $M_xSc_{3-x}N@C_{80}$, wherein x is between 0 and 3, and wherein M is one of Er, Y, Lu, or Gd.

5. The system of claim 4, wherein x is 0.

6. The system of claim 1, wherein the first contact is a semiconducting substrate.

7. The system of claim 6, wherein the semiconducting substrate is a Cu(110)-(2×1)-O substrate.

8. The system of claim 1, wherein the one or more motions comprises a switch between a pair of enantiomorphs.

9. The system of claim 1, wherein the one or more motions comprises a switch between two pairs of interconverting enantiomorphs.

10. A method, comprising:
applying a tunneling current across a tunneling junction, wherein the tunneling junction comprises an endohedral fullerene comprising a fullerene cage and a trapped cluster or a trapped atom;
exciting one or more internal motions of the trapped cluster or the trapped atom based at least in part on the tunneling current;
changing the conductance of the endohedral fullerene based at least in part on the one or more excited internal motions; and
controlling an electronic process based at least in part on the changed conductance of the endohedral fullerene.

11. The method of claim 10, wherein the endohedral fullerene is a nitride cluster fullerene.

12. The method of claim 11, wherein the nitride cluster fullerene is $Sc_3N@C_{80}$.

13. The method of claim 10, wherein the one or more motions comprises at least one translation.

14. The method of claim 10, wherein the one or more motions comprises at least one stretching.

15. The method of claim 10, wherein the one or more motions comprises at least one rotation.

16. The method of claim 15, wherein the rotation comprises rotation around a $C_3$ axis.

17. The method of claim 15, wherein the rotation comprises rotation between two $C_3$ axes.

18. The method of claim 10, wherein the one or more motions comprises a switch between two pairs of interconverting enantiomorphs.

19. A method, comprising:
selecting an endohedral fullerene for use in a single molecule switch, wherein the endohedral fullerene comprising a fullerene cage and a trapped cluster or a trapped atom;
selecting a substrate for use in the single molecule switch, wherein the substrate is selected based at least in part on one or more switching properties of the endohedral fullerene in combination with the substrate;
depositing one or more molecules of the endohedral fullerene on the substrate; and
creating a tunneling junction comprising the substrate, the endohedral fullerene, and a contact.

20. The method of claim 19, further comprising forming a template on the substrate, wherein the depositing is based at least in part on the template.

* * * * *